(12) United States Patent
Tanaka et al.

(10) Patent No.: US 9,978,441 B2
(45) Date of Patent: May 22, 2018

(54) SEMICONDUCTOR MEMORY DEVICE

(71) Applicant: TOSHIBA MEMORY CORPORATION, Minato-ku (JP)

(72) Inventors: Chika Tanaka, Fujisawa (JP); Keiji Ikeda, Kawasaki (JP); Toshinori Numata, Yokkaichi (JP); Tsutomu Tezuka, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days. days.

(21) Appl. No.: 15/445,230

(22) Filed: Feb. 28, 2017

(65) Prior Publication Data

US 2018/0082733 A1 Mar. 22, 2018

(30) Foreign Application Priority Data

Sep. 20, 2016 (JP) .................................. 2016-183441

(51) Int. Cl.
*G11C 7/02* (2006.01)
*G11C 11/4091* (2006.01)
*G11C 11/404* (2006.01)
*G11C 11/408* (2006.01)
*G11C 11/4094* (2006.01)

(52) U.S. Cl.
CPC ...... *G11C 11/4091* (2013.01); *G11C 11/4045* (2013.01); *G11C 11/4087* (2013.01); *G11C 11/4094* (2013.01)

(58) Field of Classification Search
CPC .............. G11C 11/404; G11C 11/4091; G11C 11/4099; G11C 7/062; G11C 7/14; G11C 11/15; G11C 11/5607; G11C 13/0002; G11C 13/0004; G11C 13/0011; G11C 13/003; G11C 13/004; G11C 13/0069; G11C 16/12
USPC ......... 365/154, 158, 185.23, 189.09, 189.11, 365/190, 193, 194, 196, 203, 205, 207, 365/208, 227
See application file for complete search history.

(56) References Cited

U.S. PATENT DOCUMENTS

| 5,646,900 | A | * | 7/1997 | Tsukude | G11C 5/146 365/189.09 |
|---|---|---|---|---|---|
| 6,151,260 | A | | 11/2000 | Birk | |
| 6,373,765 | B1 | | 4/2002 | Birk | |
| 7,539,042 | B2 | | 5/2009 | Tomita | |

FOREIGN PATENT DOCUMENTS

| JP | 2000-100175 | 4/2000 |
| JP | 2011-154754 | 8/2011 |
| JP | 5426069 | 2/2014 |

* cited by examiner

*Primary Examiner* — Thong Q Le
(74) *Attorney, Agent, or Firm* — Oblon, McClelland, Maier & Neustadt, L.L.P.

(57) ABSTRACT

According to one embodiment, a semiconductor memory device includes a memory cell, a sense amplifier, a first transfer transistor, a second transfer transistor, and a controller. The memory cell can store a first value and a second value. The sense amplifier amplifies the first value or the second value read from the memory cell to the sense node. The first transfer transistor has a first control terminal connected to the sense node. The second transfer transistor has a second control terminal connected to the sense node. The controller applies a backgate potential to backgate terminals of the first transfer transistor and the second transfer transistor.

20 Claims, 22 Drawing Sheets

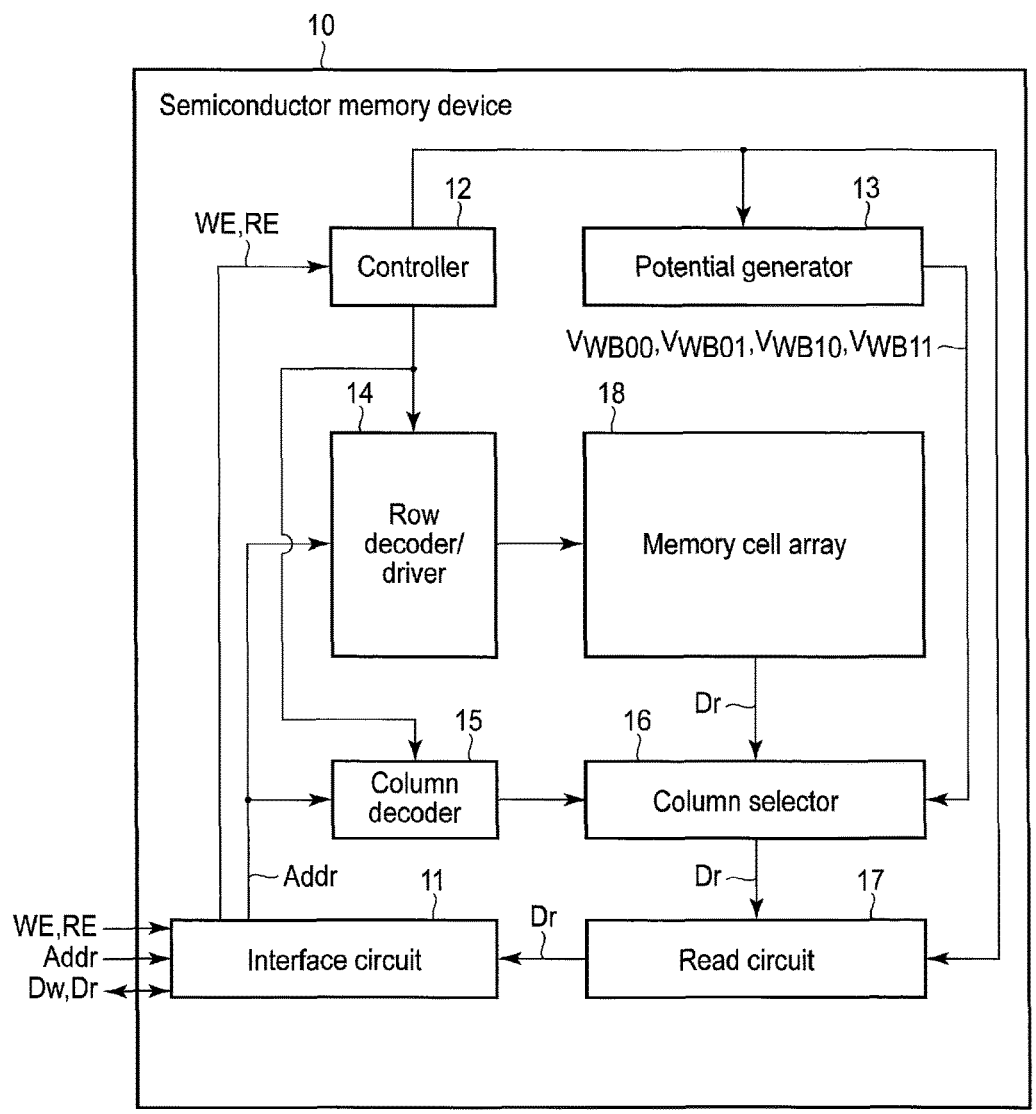
F I G. 1

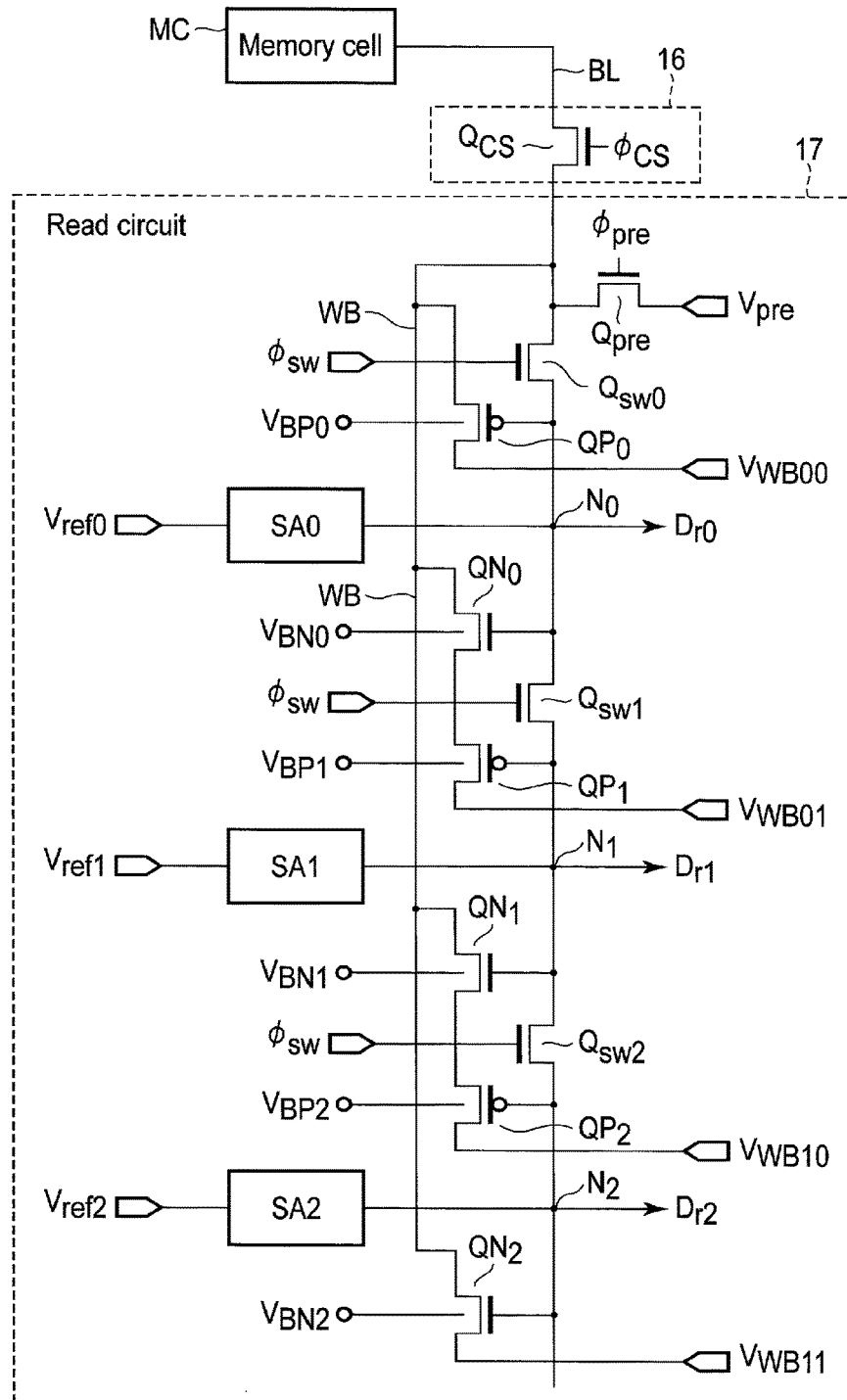
F I G. 2

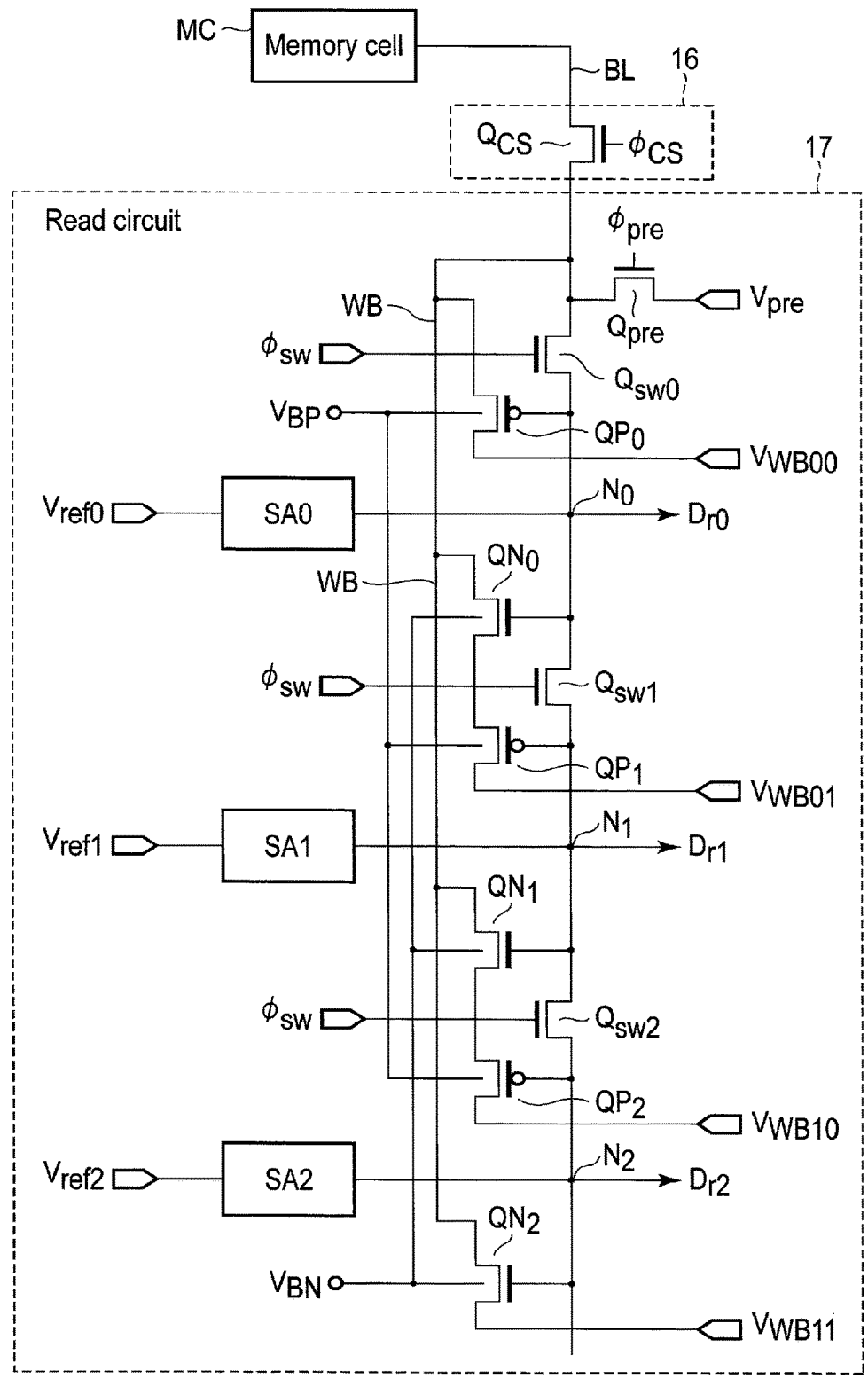
F I G. 3

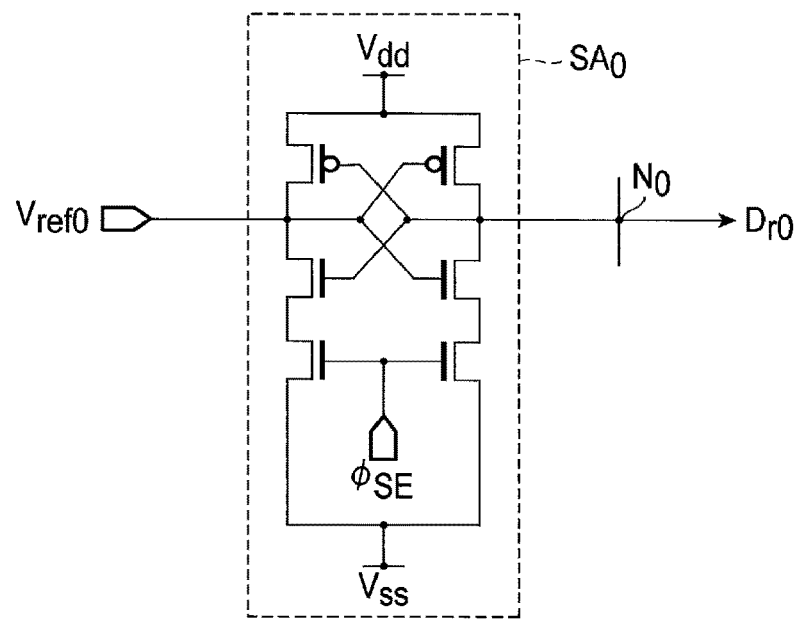
F I G. 4A
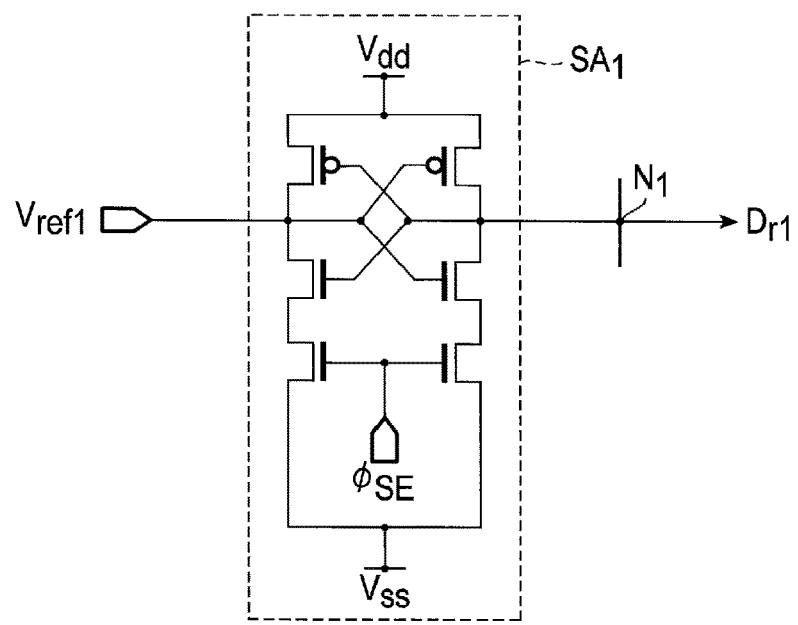
F I G. 4B

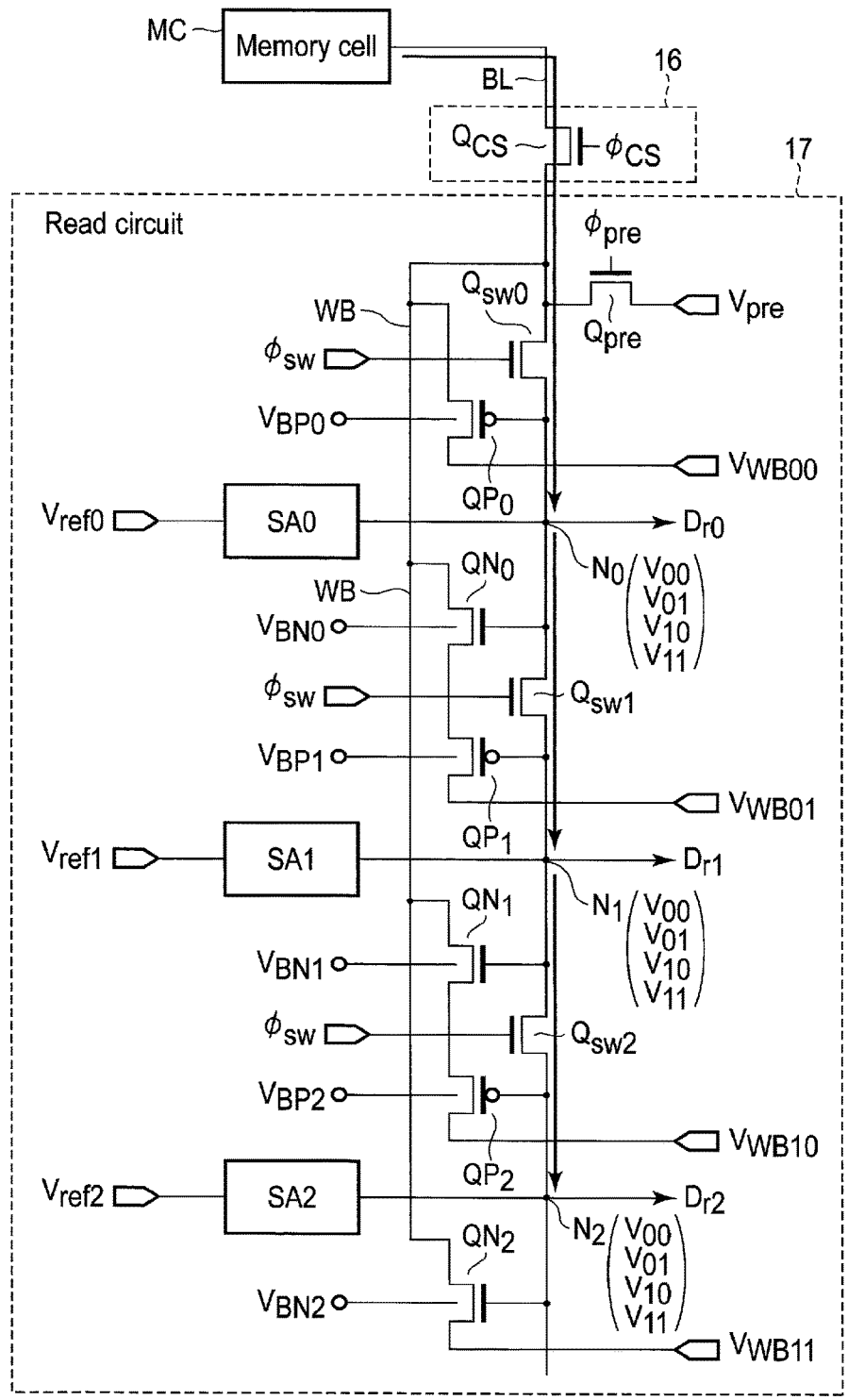
F I G. 5

| Read data | $N_0$ ($D_{r0}$) | $N_1$ ($D_{r1}$) | $N_2$ ($D_{r2}$) | $QP_0$ | $QN_0$ | $QP_1$ | $QN_1$ | $QP_2$ | $QN_2$ | Write-back data |
|---|---|---|---|---|---|---|---|---|---|---|
| 11 | 1 | 1 | 1 | Off | On | Off | On | Off | On | $V_{WB11}(11)$ |
| 10 | 1 | 1 | 0 | Off | On | Off | On | On | Off | $V_{WB10}(10)$ |
| 01 | 1 | 0 | 0 | Off | On | On | Off | On | Off | $V_{WB01}(01)$ |
| 00 | 0 | 0 | 0 | On | Off | On | Off | On | Off | $V_{WB00}(00)$ |
F I G. 7
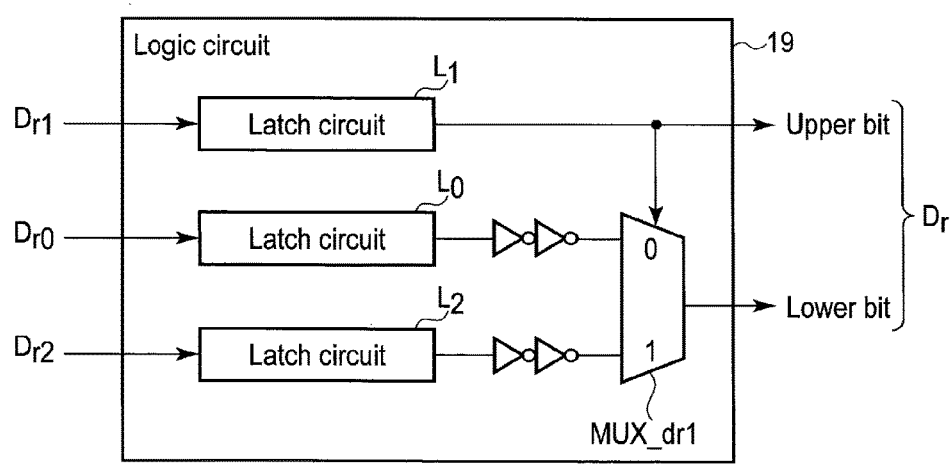
F I G. 8

| $D_{r0}$ | $D_{r1}$ | $D_{r2}$ | 2-bit read data $D_r$ |
|---|---|---|---|
| 1 | 1 | 1 | 11 |
| 1 | 1 | 0 | 10 |
| 1 | 0 | 0 | 01 |
| 0 | 0 | 0 | 00 |
F I G. 9
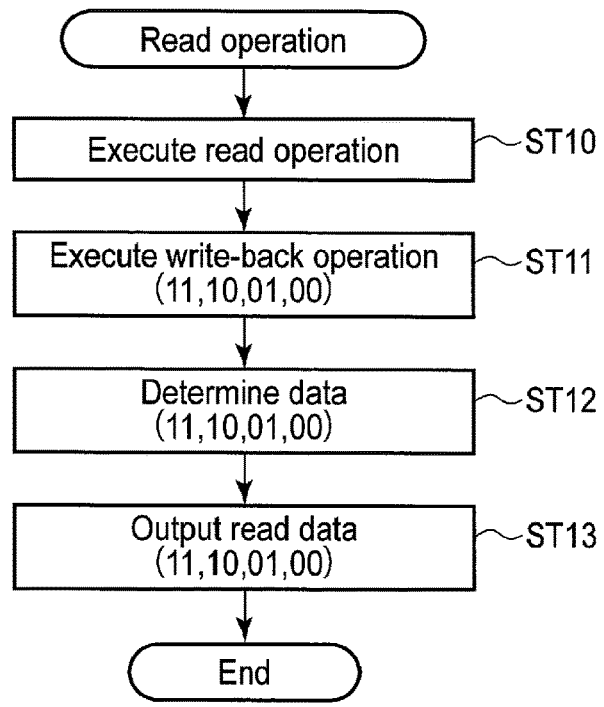
F I G. 10

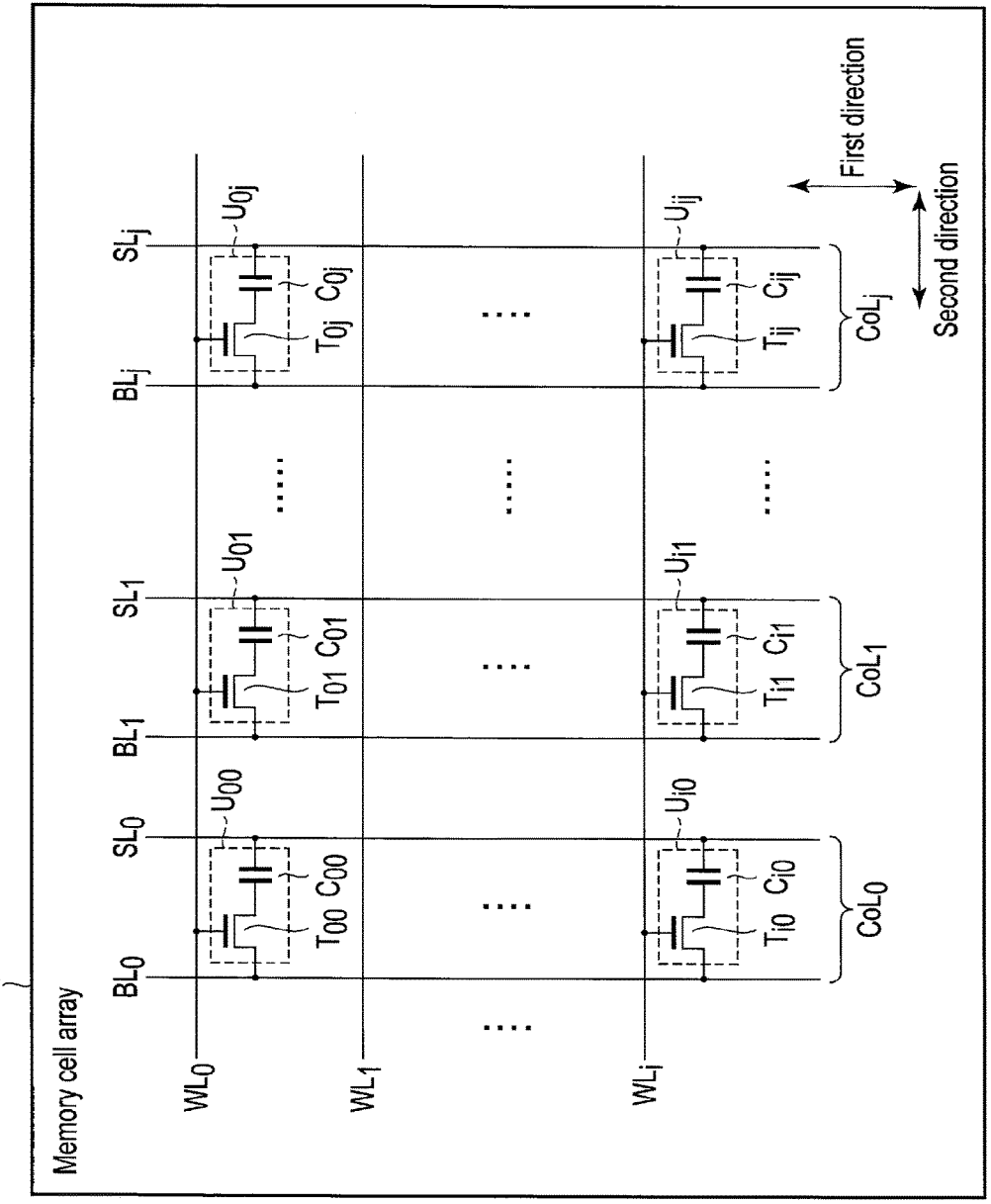
F I G. 11

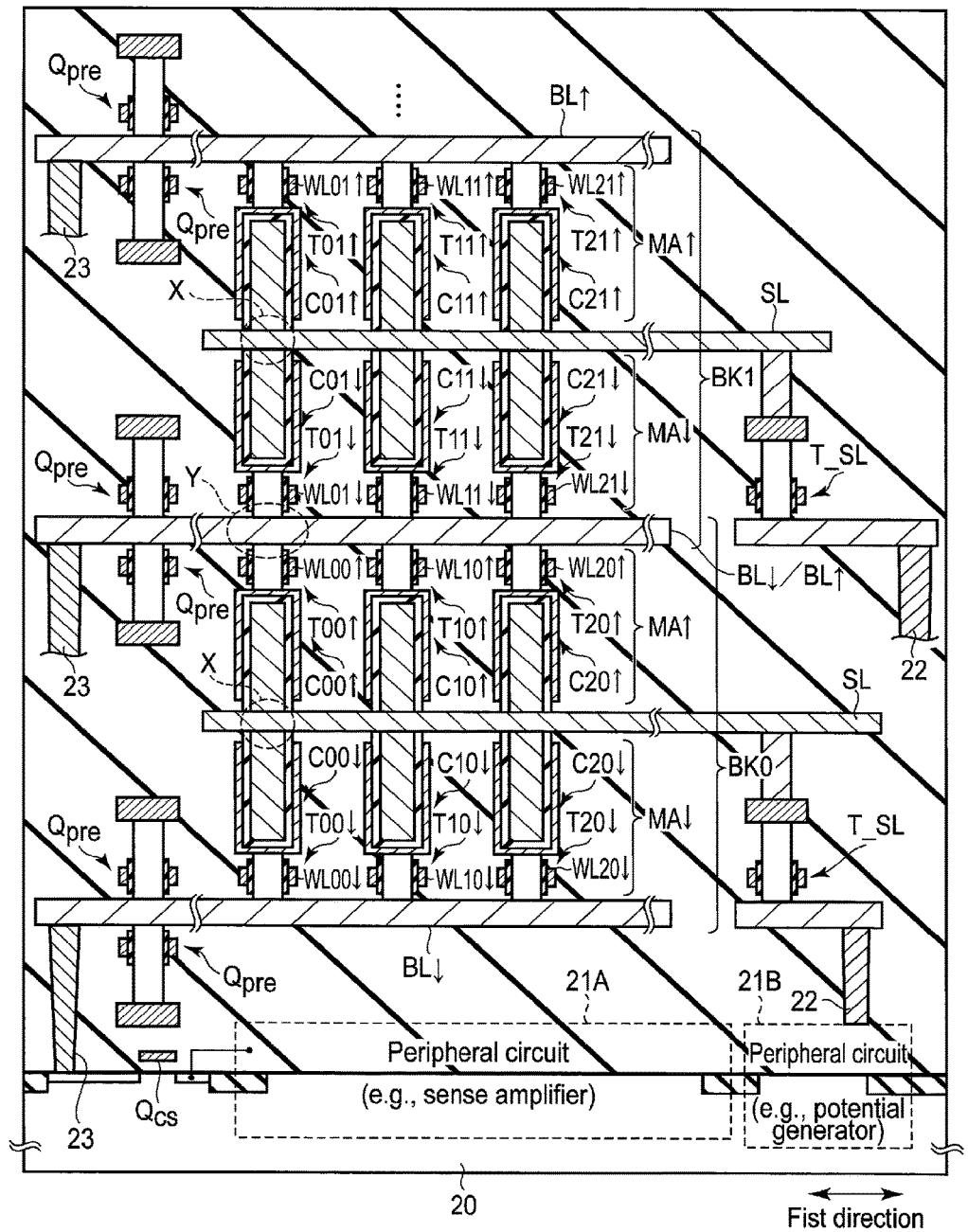
F I G. 14

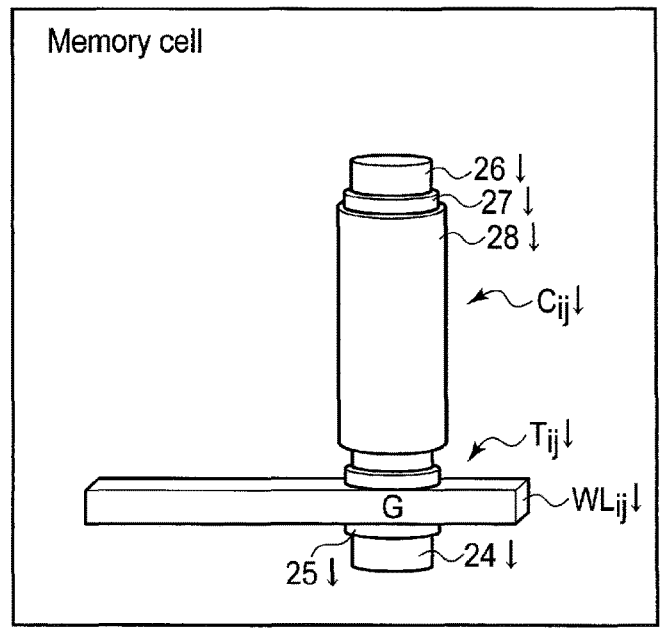
F I G. 15
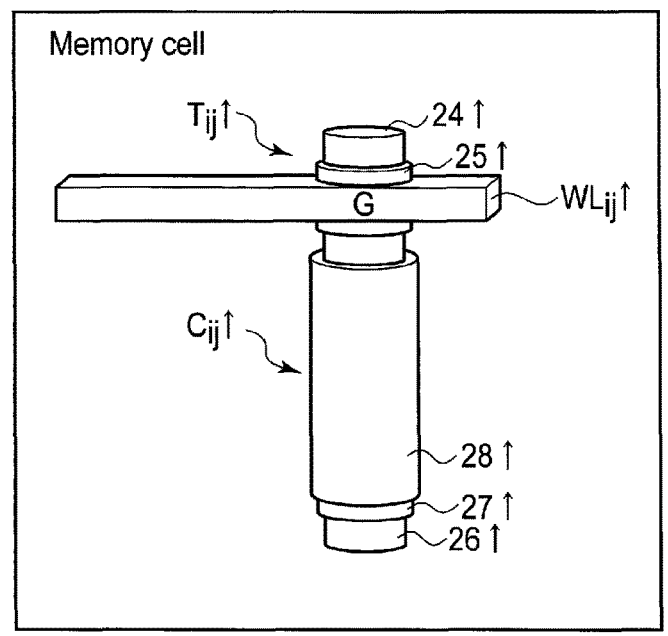
F I G. 16

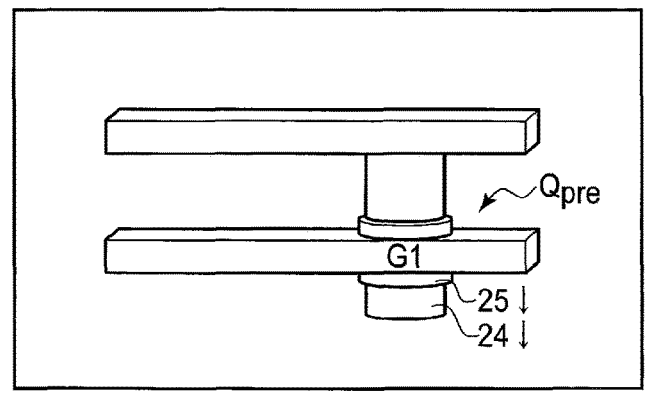
F I G. 17
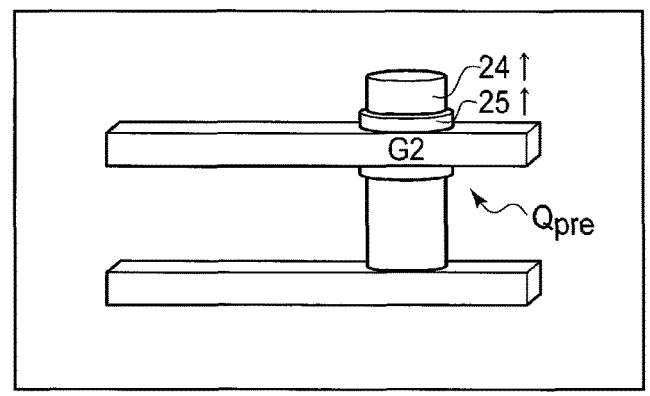
F I G. 18
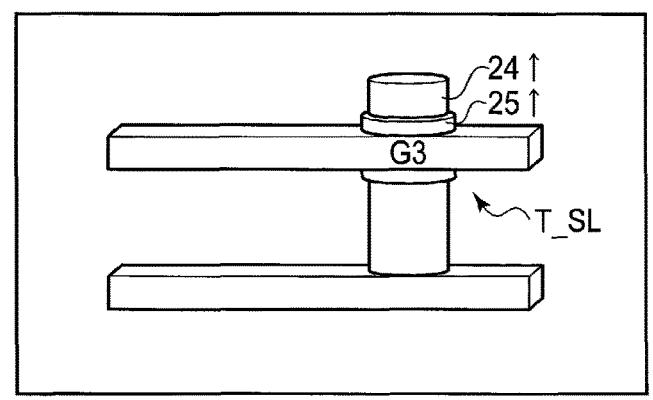
F I G. 19

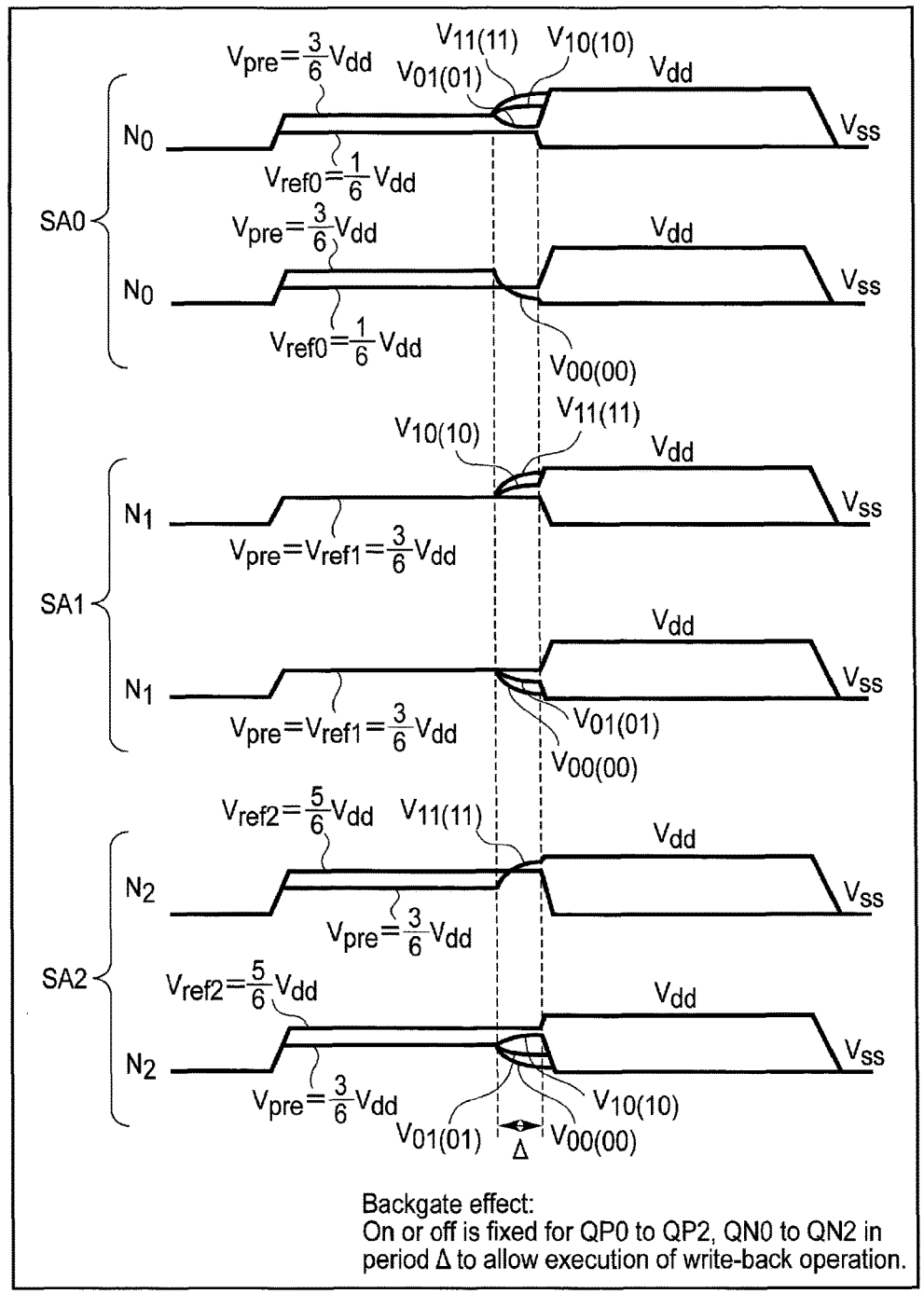
F I G. 20

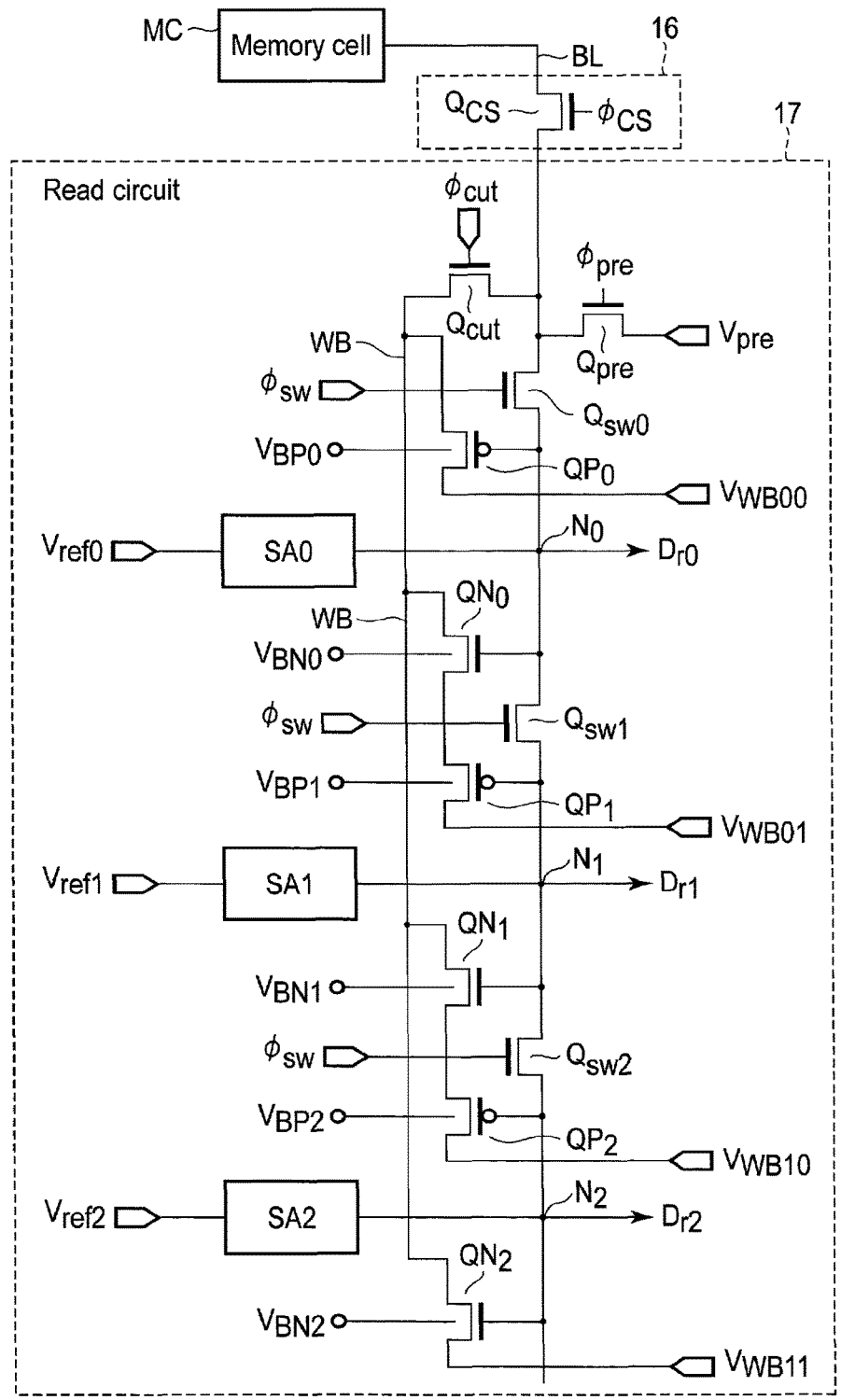
F I G. 21

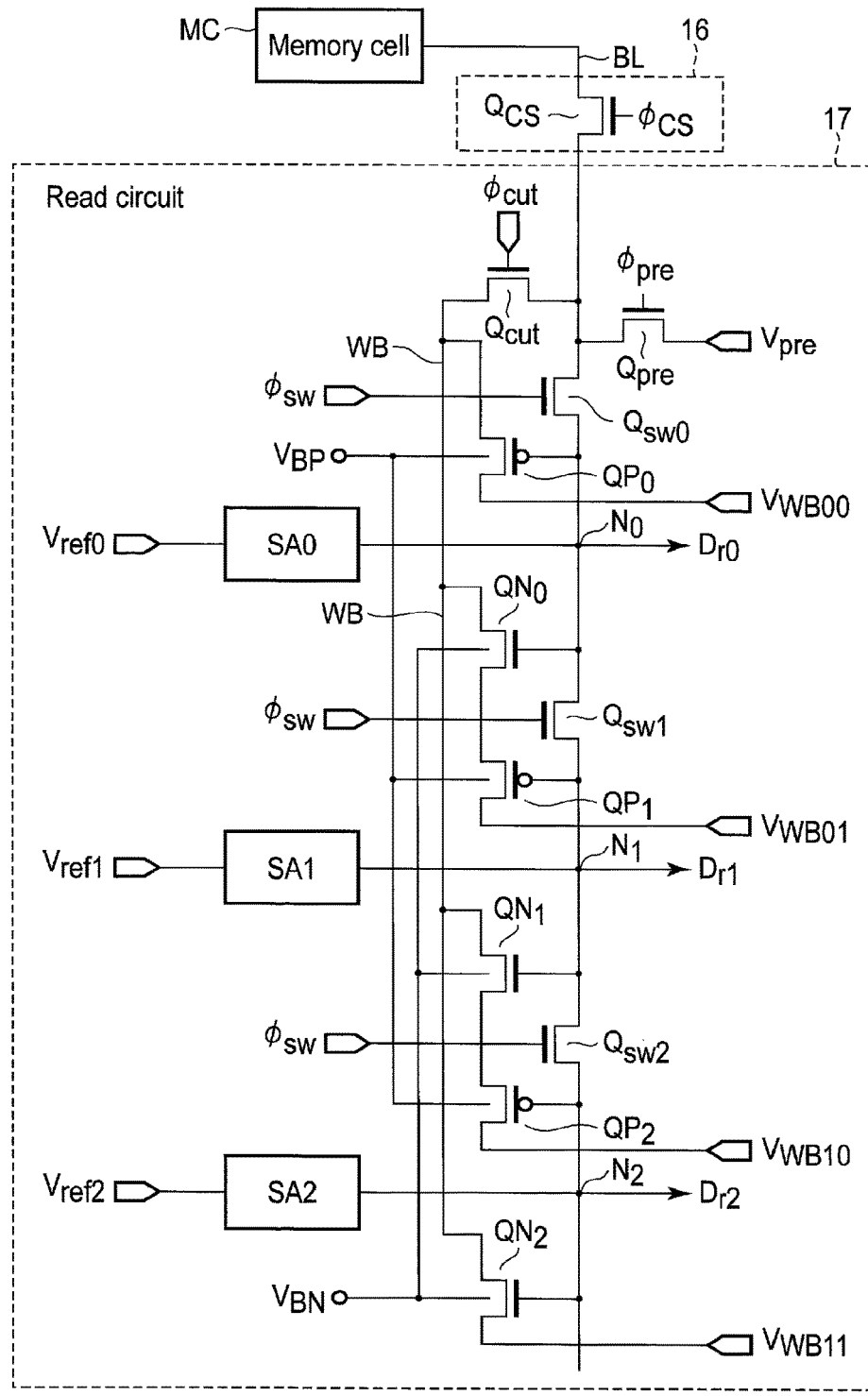
F I G. 22

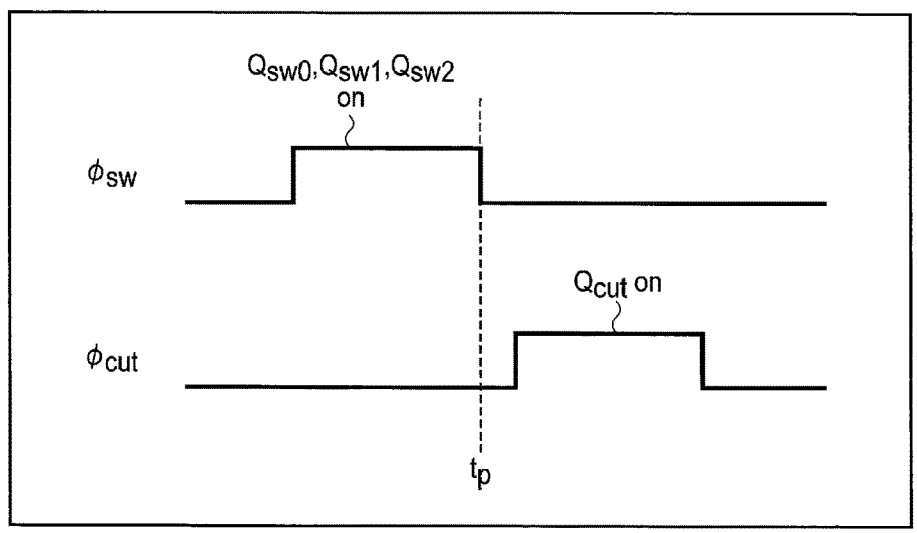
F I G. 23

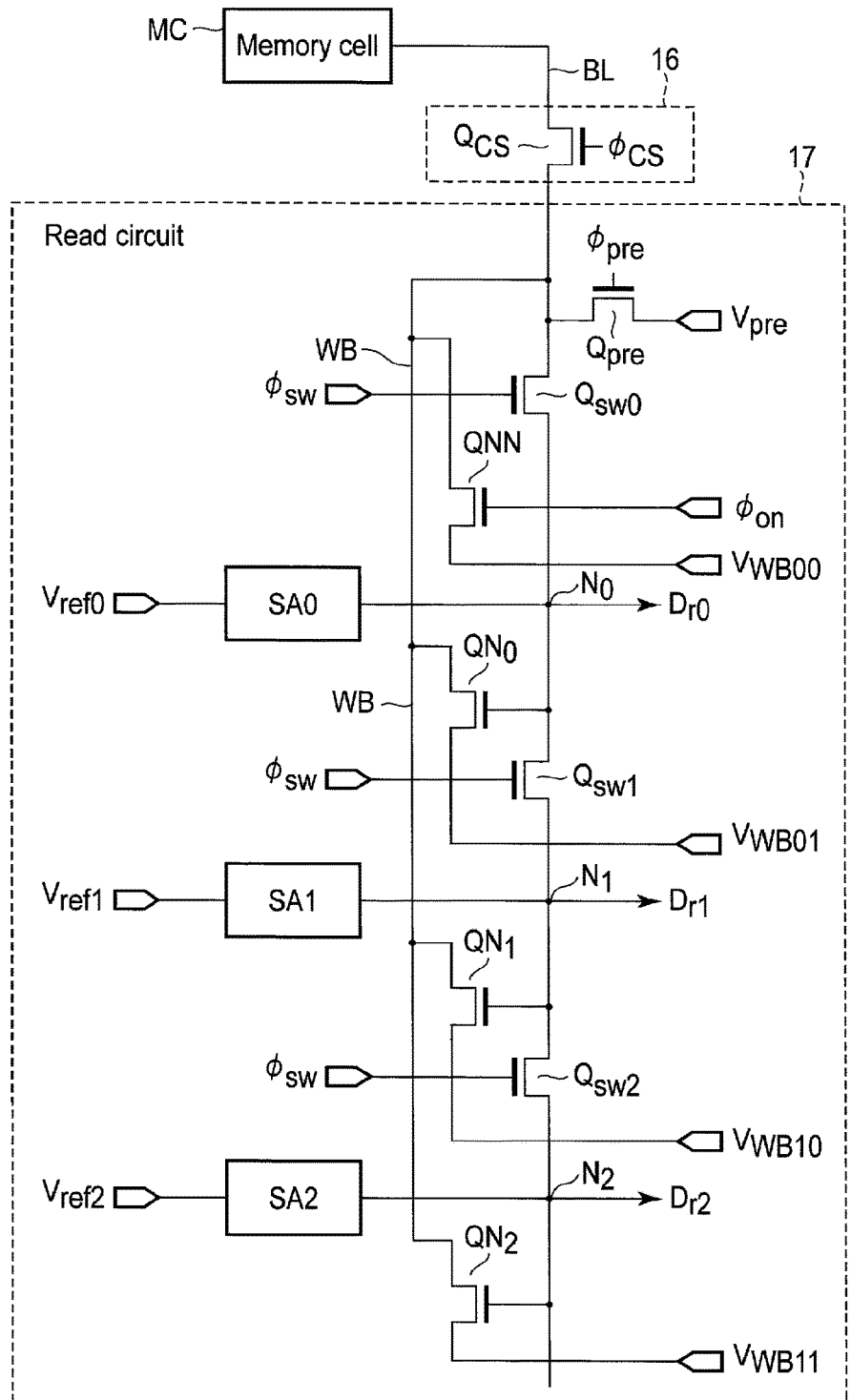
F I G. 24

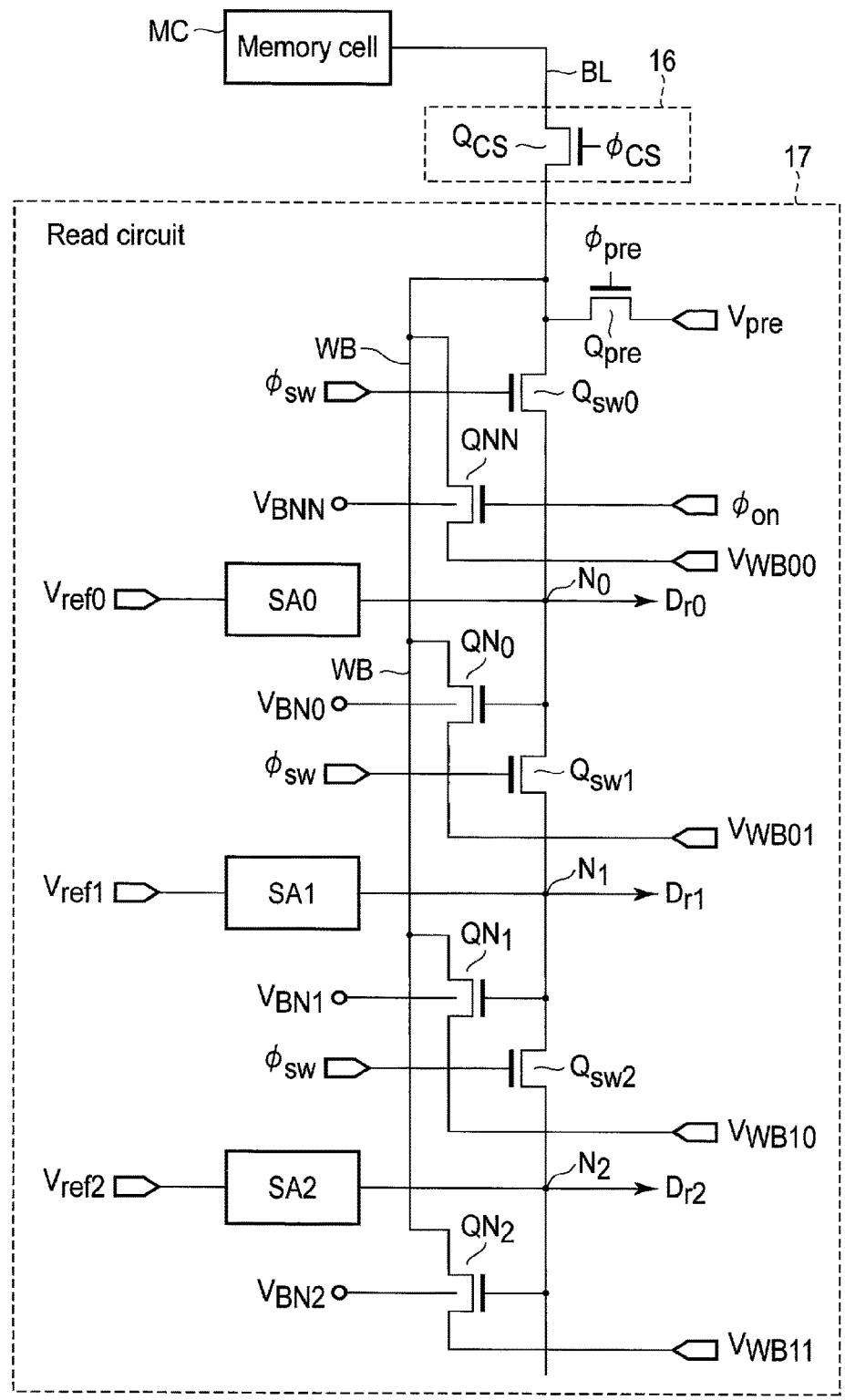
F I G. 25

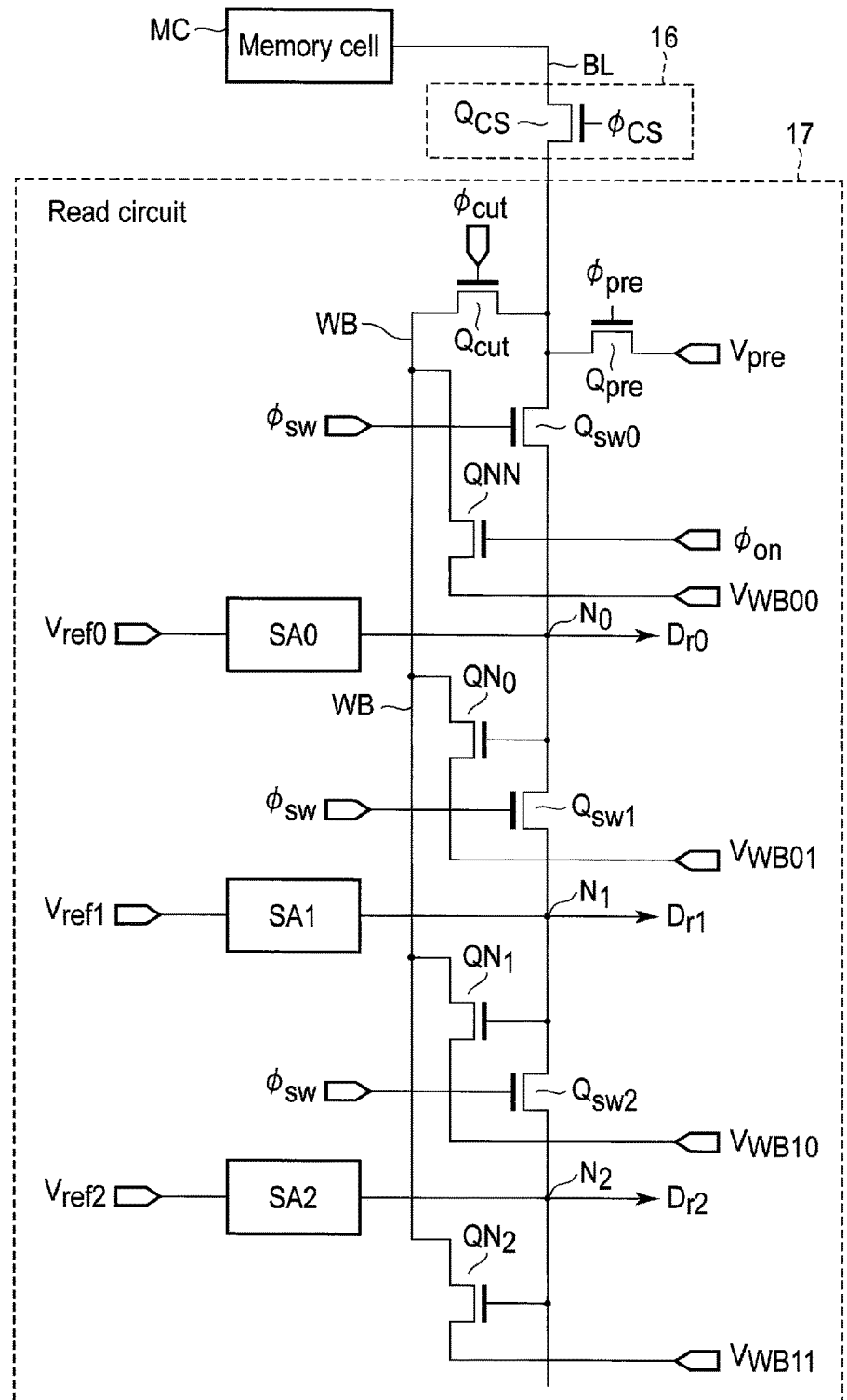
F I G. 26

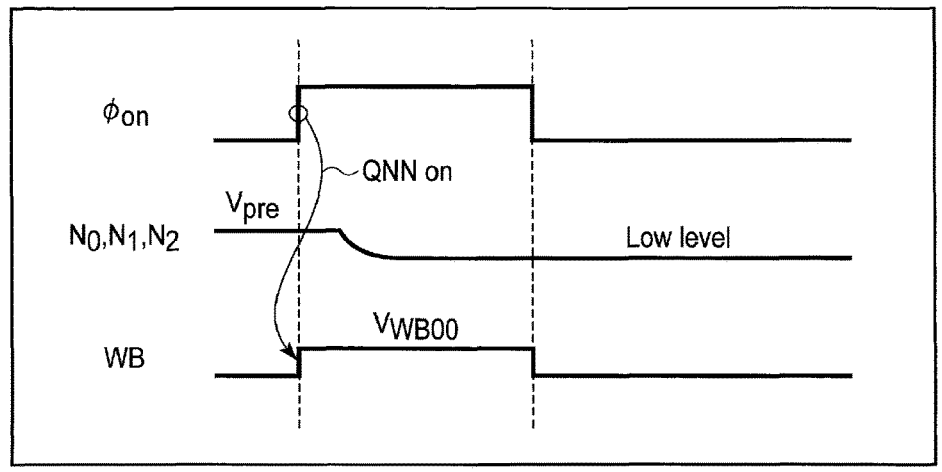
F I G. 27A
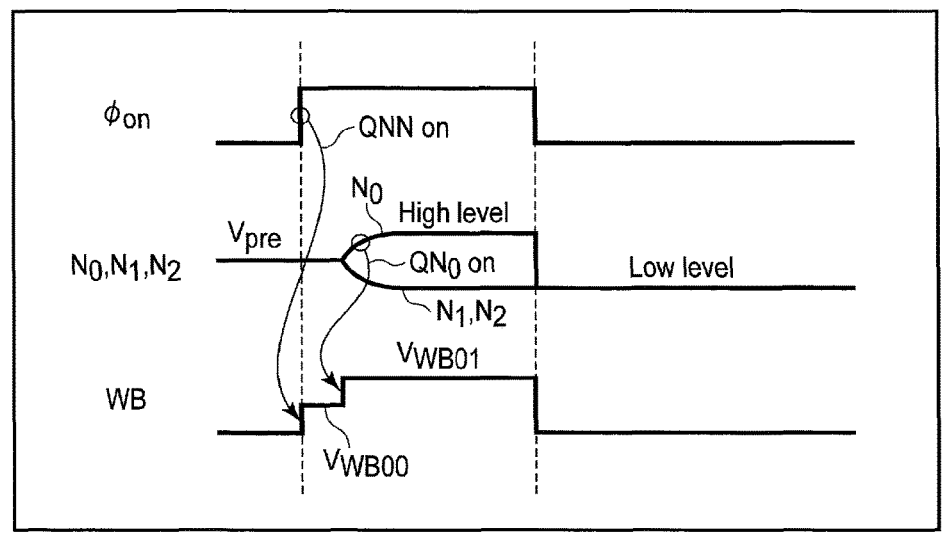
F I G. 27B

SEMICONDUCTOR MEMORY DEVICE

CROSS-REFERENCE TO RELATED APPLICATIONS

This application is based upon and claims the benefit of priority from Japanese Patent Application No. 2016-183441, filed Sep. 20, 2016, the entire contents of which are incorporated herein by reference.

FIELD

Embodiments described herein relate generally to semiconductor memory devices.

BACKGROUND

A semiconductor memory device, such as a dynamic random access memory (DRAM), destructs data in memory cells in read operations (destructive read system). The read data is re-written to the memory cells in a write-back operation following the read operation. However, a memory cell has come to store more than a bit (multi-bit) in recent years. This causes a problem, such as increased time required for the write-back operation.

BRIEF DESCRIPTION OF THE DRAWINGS

FIG. 1 is a block diagram of a semiconductor memory device;
FIG. 2 is a circuit diagram of a read circuit according to a first embodiment;
FIG. 3 is a circuit diagram of a read circuit according to the first embodiment;
FIG. 4A is a circuit diagram illustrating an example sense amplifier;
FIG. 4B is a circuit diagram illustrating an example sense amplifier;
FIG. 5 is a circuit diagram illustrating an example read operation;
FIG. 7 illustrates turn-on and turn-off of write-back transistors relative to write-back data;
FIG. 8 is a block diagram illustrating an example logic circuit that determines read data;
FIG. 9 illustrates electric potential of sense nodes relative to read data;
FIG. 10 is a flowchart of an example read operation;
FIG. 11 is a circuit diagram illustrating an example memory cell array;
FIG. 14 is a cross-sectional view taken along line XIV-XIV of FIG. 13;
FIG. 15 is a schematic view illustrating an example structure of a memory cell;
FIG. 16 is a schematic view illustrating an example structure of a memory cell;
FIG. 17 is a schematic view illustrating an example structure of a transistor;
FIG. 18 is a schematic view illustrating an example structure of a transistor;
FIG. 19 is a schematic illustrating an example structure of a transistor;
FIG. 20 is a waveform diagram illustrating an example waveform of sense amplifiers;
FIG. 21 is a circuit diagram of a read circuit according to a second embodiment;
FIG. 22 is a circuit diagram of a read circuit according to the second embodiment;
FIG. 23 is a waveform diagram for explaining a circuit operation of a read circuit according to the second embodiment;
FIG. 24 is a circuit diagram of a read circuit according to a third embodiment;
FIG. 25 is a circuit diagram of a read circuit according to a combination of the first and third embodiments;
FIG. 26 is a circuit diagram of a read circuit according to a combination of the first to third embodiments;
FIG. 27A is a waveform diagram of the electric potential of sense nodes relative to a write-back potential;
FIG. 27B is a waveform diagram of the electric potential of sense nodes relative to a write-back potential.

DETAILED DESCRIPTION

Figure 4C:
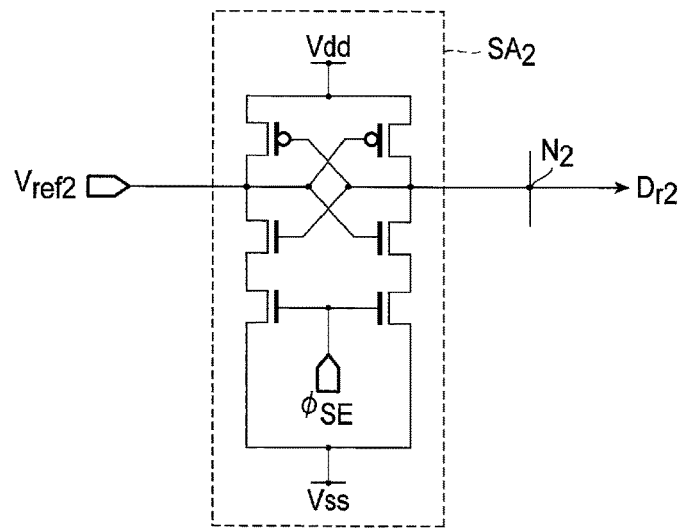
FIG. 4C is a circuit diagram illustrating an example sense amplifier.

In general, according to one embodiment, a semiconductor memory device includes a memory cell, a sense amplifier, a first transfer transistor, a second transfer transistor, and a controller. The memory cell can store a first value and a second value. The sense amplifier amplifies the sense node to a first read potential when the first value is read from the memory cell to the sense node, and amplifies the sense node to a second read potential when the second value is read from the memory cell to the sense node. The first transfer transistor has a first control terminal connected to the sense node and a first backgate terminal of the first control terminal, and transfers a first write potential to the memory cell when the sense node is at the first read potential. The second transfer transistor has a second control terminal connected to the sense node and a second backgate terminal of the second control terminal, and transfers a second write potential to the memory cell when the sense node is at the second read potential. The controller applies a first backgate potential to the first backgate terminal and a second backgate potential to the second backgate terminal.

Embodiments will be described below by referring to the accompanying drawings. In the drawings, the same reference signs are given to the same portions.

Block Diagram

FIG. 1 is a block diagram of a semiconductor memory device.

A semiconductor memory device (e.g., DRAM) 10 includes an interface circuit 11, a controller 12, a potential generator 13, a row decoder/driver 14, a column decoder 15, a column selector 16, a read circuit 17, and a memory cell array 18.

A write enable signal WE, a read enable signal RE, an address signal Addr, and write data Dw are supplied to the interface circuit 11 from the outside of the semiconductor memory device 10. The read data Dr is output from the interface circuit 11 to the outside of the semiconductor memory device 10.

The write enable signal WE and the read enable signal RE are transferred from the interface circuit 11 to the controller 12.

The controller 12 controls the potential generator 13, the row decoder/driver 14, the column decoder 15, and the read circuit 17.

Upon receipt of the write enable signal WE, for example, the controller 12 executes a write operation by enabling the potential generator 13, the row decoder/driver 14, and the column decoder 15 to an operation state, while bringing the read circuit 17 to a non-operation state.

Upon receipt of the read enable signal RE, for example, the controller 12 executes a read operation by enabling the potential generator 13, the row decoder/driver 14, the column decoder 15, and the read circuit 17 to the operation state.

The semiconductor memory device 10 of the present embodiment uses a so-called destructive read system in which data in memory cells to be read is destructed by the read operation. After the read operation, the controller 12, therefore, needs to execute a so-called write-back operation to rewrite read data to the memory cells to be read.

In the write-back operation following the read operation, the controller 12 instructs the potential generator 13 to generate, for example, a plurality of potentials $V_{WB00}$, $V_{WB01}$, $V_{WB10}$, $V_{WB11}$, which are needed for the write-back operation.

An address signal Addr is transferred from the interface circuit 11 to the row decoder/driver 14 and the column decoder 15.

The row decoder/driver 14 selects one of a plurality of rows of the memory cell array 18 in accordance with the address signal Addr. The column decoder 15 selects one of a plurality of columns of the memory cell array 18 using the column selector 16 in accordance with the address signal Addr.

In the following, a technique to improve reading performance of the semiconductor memory device 10 using the destructive read system is described.

A first embodiment describes a technique to improve reading performance using a backgate bias effect to allow high speed transfer of a write-back potential corresponding to read data to a memory cell. A second embodiment describes a technique to improve reading performance by decreasing parasitic capacitance to allow high speed reading of the electric potential from a memory cell to be read to a sense node. A third embodiment describes a technique to improve reading performance using only an N-channel transistor (field effect transistor (FET)) in a write-back potential transfer circuit to decrease an area of a read circuit.

First Embodiment

FIGS. 2 and 3 illustrate a read circuit according to a first embodiment.

A read circuit 17 corresponds to the read circuit 17 in FIG. 1.

An electric potential transferred from the memory cell MC to be read to sense nodes $N_0$, $N_1$, $N_2$ decreases in accordance with a decrease of the power supply voltage supplied to a memory cell array or an increase of multi-bit data stored in the memory cell MC.

When a smaller electric potential is read at the sense nodes $N_0$, $N_1$, $N_2$, the sense amplifiers SA0, SA1, SA2 need longer time to amplify such a small electric potential. Specifically, it takes longer time to fix the electric potential of the sense nodes $N_0$, $N_1$, $N_2$ to a high level or a low level.

In general, the write-back potentials $V_{WB00}$, $V_{WB01}$, $V_{WB10}$, $V_{WB11}$ are transferred to the memory cell MC by the write-back transistors (P-channel transistors) $QP_0$, $QP_1$, $QP_2$ and the write-back transistors (N-channel transistors) $QN_0$, $QN_1$, $QN_2$ after the electric potential of the sense node $N_0$, $N_1$, $N_2$ are fixed to the high level or the low level.

Since it takes longer time to fix the electric potential of the sense nodes $N_0$, $N_1$, $N_2$ to the high or low level, the transfer of the write-back potentials $V_{WB00}$, $V_{WB01}$, $V_{WB10}$, $V_{WB11}$ to the memory cell MC is delayed.

In the first embodiment, therefore, as illustrated in FIG. 2, the write-back transistors $QP_0$, $QP_1$, $QP_2$ each have a backgate terminal. Backgate potentials $V_{BP0}$, $V_{BP1}$, $V_{BP2}$, which are applied to the backgate terminals, are changed before or after the sense amplifiers SA0, SA1, SA2 are operated.

The backgate potentials $V_{BP0}$, $V_{BP1}$, $V_{BP2}$ change in a direction facilitating turn-on of the write-back transistors $QP_0$, $QP_1$, $QP_2$ from, for example, the ground potential to a positive potential.

Similarly, the write-back transistors $QN_0$, $QN_1$, $QN_2$ each have a backgate terminal and, before or after the sense amplifiers SA0, SA1, SA2 are operated, the backgate potentials $V_{BN0}$, $V_{BN1}$, $V_{BN2}$, which are applied to the backgate terminals, are changed.

The backgate potentials $V_{BN0}$, $V_{BN1}$, $V_{BN2}$ change in a direction facilitating turn-on of the write-back transistors $QN_0$, $QN_1$, $QN_2$, for example, from the ground potential to a negative potential.

Thus, the first embodiment uses a backgate bias effect to achieve high speed transfer of the write-back potentials $V_{WB00}$, $V_{WB01}$, $V_{WB10}$, $V_{WB11}$ corresponding to the read data to the memory cell MC, thus decreasing the time required for the write-back operation.

Meanwhile, $2^n$ write-back potentials, for example, have to be set within a certain voltage range in accordance with development of multi-bit, where n is the number of bits stored in a memory cell MC. Namely, a plurality of write-back potentials ranging from a small value to a large value have to be transferred by the same kind of write-back transistors (P-channel transistors $QP_0$, $QP_1$, $QP_2$ or N-channel transistors $QN_0$, $QN_1$, $QN_2$).

As well-known in the art, however, an on-voltage, a saturation voltage, or the like of the same kind of write-back transistors are determined in accordance with, for example, a voltage between gate and source. Specifically, the write-back potential may not sufficiently be transferred to the memory cell MC because of insufficient voltage applied between the gate and the source of the write-back transistor depending on the value of the write-back potential (source potential of the write-back transistor).

According to the present embodiment, the backgate potential (threshold voltages with which the transistors are turned on) of the write-back transistors $QP_0$, $QP_1$, $QP_2$, $QN_0$, $QN_1$, $QN_2$ can be controlled according to the values of the write-back potential. Specifically, a gate overdrive voltage of the write-back transistors $QP_0$, $QP_1$, $QP_2$, $QN_0$, $QN_1$, $QN_2$ are controlled to apply a sufficient voltage between the gate and the source of the write-back transistor regardless of the values of the write-back potential. Thus, a sufficient write-back potential can be transferred to the memory cell MC.

As a result, the present embodiment can improve reading performance.

A specific structure of the read circuit 17 is described.

The memory cell MC can store at least first and second values. Specifically, the memory cell MC can store $2^n$ values (n is a natural number equal to or larger than 1) including the first and second values.

The present embodiment describes an example case in which n=2, that is, the memory cell MC stores 2-bit data (four values).

If n=1, the sense amplifiers SA1, SA2, the write-back transistors $QP_1$, $QP_2$, and the write-back transistors $QN_1$, $QN_2$ are eliminated. If n is equal to or larger than 3, the number of the sense amplifiers and the write-back transistors is increased.

The memory cell MC is connected to the read circuit 17 via the column selector 16. The column selector 16 includes an N-channel transistor $Q_{CS}$. A control signal $\varphi_{CS}$ is supplied to a control terminal of the N-channel transistor $Q_{CS}$.

The read circuit 17 includes $(2^n-1)$ sense nodes. In the present embodiment, the read circuit 17 includes three sense nodes $N_0$, $N_1$, $N_2$. The three sense nodes $N_0$, $N_1$, $N_2$ are separated from each other by switch elements $Q_{SW0}$, $Q_{SW1}$, $Q_{SW2}$. The switch elements $Q_{SW0}$, $Q_{SW1}$, $Q_{SW2}$ are, for example, N-channel transistors each having a control terminal that receives the control signal $\varphi_{SW}$.

A precharge transistor $Q_{pre}$ sets the three sense nodes $N_0$, $N_1$, $N_2$ to precharge potential $V_{pre}$ in the read operation. The precharge transistor $Q_{pre}$ is, for example, an N-channel transistor having a control terminal that receives the control signal $\varphi_{pre}$.

The sense amplifier SA0 amplifies the electric potential of the sense node $N_0$ in accordance with the electric potential of the sense node $N_0$ and reference potential $V_{ref0}$. The sense amplifier SA0 includes a circuit as illustrated, for example, in FIG. 4A. The sense amplifier SA0 enters the operation state when a sense amplifier enable signal $\varphi_{SE}$ is set to a high level.

When, for example, the electric potential of the sense node $N_0$ is lower than the reference potential $V_{ref0}$, the sense amplifier SA0 amplifies the electric potential of the sense node $N_0$ to a low level. When the electric potential of the sense node $N_0$ is higher than the reference potential $V_{ref0}$, the sense amplifier SA0 amplifies the electric potential of the sense node $N_0$ to a high level.

The sense amplifier SA1 amplifies the electric potential of the sense node $N_1$ in accordance with the electric potential of the sense node $N_1$ and the reference potential $V_{ref1}$. The sense amplifier SA1 includes a circuit such as a circuit illustrated in FIG. 4B. The sense amplifier SA1 enters the operation state when the sense amplifier enable signal $\varphi_{SE}$ is set to the high level.

When, for example, the electric potential of the sense node $N_1$ is lower than the reference potential $V_{ref1}$, the sense amplifier SA1 amplifies the electric potential of the sense node $N_1$ to the low level. When the electric potential of the sense node $N_1$ is higher than the reference potential $V_{ref1}$, the sense amplifier SA1 amplifies the electric potential of the sense node $N_1$ to the high level.

The sense amplifier SA2 amplifies the electric potential of the sense node $N_2$ in accordance with the electric potential of the sense node $N_2$ and the reference potential $V_{ref2}$. The sense amplifier SA2 includes a circuit such as a circuit illustrated in FIG. 4C. The sense amplifier SA2 enters the operation state when the sense amplifier enable signal $\varphi_{SE}$ is set to the high level.

When, for example, the electric potential of the sense node $N_2$ is lower than the reference potential $V_{ref2}$, the sense amplifier SA2 amplifies the electric potential of the sense node $N_2$ to the low level. When, for example, the electric potential of the sense node $N_2$ is higher than the reference potential $V_{ref2}$, the sense amplifier SA2 amplifies the electric potential of the sense node $N_2$ to the high level.

The write-back transistor (transfer transistor) $QP_0$ has a control terminal connected to the sense node $N_0$ and a backgate terminal provided as a backgate of the control terminal. The write-back transistor $QP_0$ is in the on-state when the sense node $N_0$ is at the low level, allowing transfer of write-back potential $V_{WB00}$ to the memory cell MC via a write-back potential line (conductive wire) WB.

A backgate potential $V_{BP0}$ applied to the backgate terminal of the write-back transistor $QP_0$ changes, for example, from the ground potential to a positive potential before or after the sense amplifier SA0 is operated.

Thus, the write-back transistor $QP_0$ enters the on-state before the low level of the sense node $N_0$ is fixed to the low level or when the sense node $N_0$ is changing to the low level. This allows the write-back potential $V_{WB00}$ to be transferred to the memory cell MC. Namely, high speed transfer of the write-back potential $V_{WB00}$ to the memory cell MC is achieved in the write-back operation following the read operation.

The write-back transistor (transfer transistor) $QN_0$ has the control terminal connected to the sense node $N_0$ and the backgate terminal serving as the backgate of the control terminal. The write-back transistor $QN_0$ is in the on-state when the sense node $N_0$ is at the high level. The write-back transistor (transfer transistor) $QP_1$ has a control terminal connected to the sense node $N_1$ and a backgate terminal serving as the backgate of the control terminal. The write-back transistor $QP_1$ is in the on-state when the sense node $N_1$ is at the low level.

The write-back potential $V_{WB01}$ is transferred to the memory cell MC via the write-back potential line WB when the write-back transistor $QN_0$ and the write-back transistor $QP_1$ are in the on-state.

The backgate potential $V_{BN0}$ applied to the backgate terminal of the write-back transistor $QN_0$ changes, for example, from the ground potential to a negative potential, while the backgate potential $V_{BP1}$ applied to the backgate terminal of the write-back transistor $QP_1$ changes, for example, from the ground potential to a positive potential, before or after the sense amplifiers SA0, SA1 are operated.

The write-back transistor $QN_0$ enters the on-state before the sense node $N_0$ is fixed to the high level or when the sense node $N_0$ is changing to the high level. The write-back transistor $QP_1$ enters the on-state before the sense node $N_1$ is fixed to the low level or when the sense node $N_1$ is changing to the low level. Thus, high speed transfer of the write-back potential $V_{WB01}$ to the memory cell MC is achieved in the write-back operation following the read operation.

The write-back transistor (transfer transistor) $QN_1$ has a control terminal connected to the sense node $N_1$ and a backgate terminal serving as the backgate of the control terminal. The write-back transistor $QN_1$ is in the on-state when the sense node $N_1$ is at the high level. The write-back transistor (transfer transistor) $QP_2$ has a control terminal connected to the sense node $N_2$ and a backgate terminal serving as the backgate of the control terminal. The write-back transistor $QP_2$ is in the on-state when the sense node $N_2$ is at the low level.

The write-back potential $V_{WB10}$ is transferred to the memory cell MC via the write-back potential line WB when the write-back transistor $QN_1$ and the write-back transistor $QP_2$ are in the on-state.

The backgate potential $V_{BN1}$ applied to the backgate terminal of the write-back transistor $QN_1$ changes, for example, from the ground potential to a negative potential, while the backgate potential $V_{BP2}$ applied to the backgate terminal of the write-back transistor $QP_2$ changes, for example, from the ground potential to a positive potential before or after the sense amplifiers SA1, SA2 are operated.

The write-back transistor $QN_1$ enters the on-state before the sense node $N_1$ is fixed to the high level or when the sense node $N_1$ is changing to the high level. The write-back transistor $QP_2$ is in the on-state before the sense node $N_2$ is fixed to the low level, or the sense node $N_2$ is changing to the low level. Thus, high-speed transfer of the write-back potential $V_{WB10}$ to the memory cell MC is achieved in the write-back operation following the read operation.

The write-back transistor (transfer transistor) $QN_2$ has a control terminal connected to the sense node $N_2$ and a backgate terminal serving as the backgate of the control terminal. The write-back transistor $QN_2$ is in the on-state when the sense node $N_2$ is at the high level, allowing the transfer of the write-back potential $V_{WB11}$ to the memory cell MC via the write-back potential line WB.

The backgate potential $V_{BN2}$ applied to the backgate terminal of the write-back transistor $QN_2$ changes, for example, from the ground potential to a negative potential before or after the sense amplifier SA2 is operated.

The write-back transistor $QN_2$ is in the on-state before the sense node $N_2$ is fixed to the high level, or the sense node $N_2$ is changing to the high level. This allows transfer of the write-back potential $V_{WB11}$ to the memory cell MC. Thus, high speed transfer of the write-back potential $V_{WB11}$ to the memory cell MC is achieved in the write-back operation following the read operation.

Backgate terminals of the write-back transistors $QP_0$, $QP_1$, $QP_2$, which serve as P-channel transistors, may be commonly connected, as illustrated in FIG. 3. In this case, the backgate potential $V_{BP}$ is commonly applied to the backgate terminal of the write-back transistors $QP_0$, $QP_1$, $QP_2$. Backgate terminals of the write-back transistors $QN_0$, $QN_1$, $QN_2$, which serve as N-channel transistors, may be commonly connected. In this case, the backgate potential $V_{BN}$ is commonly applied to the backgate terminal of the write-back transistors $QN_0$, $QN_1$, $QN_2$.

Operation

An example write-back operation using the read circuit illustrated in FIG. 2 is described.

Figure 6:
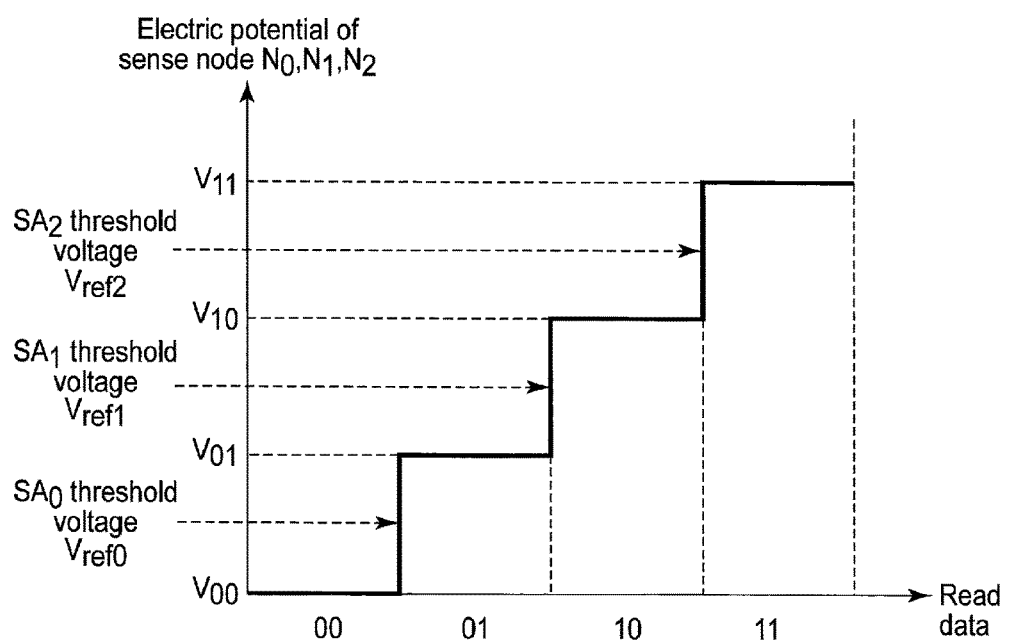
FIG. 6 is a graph illustrating read data relative to electric potential of sense nodes.

As illustrated in FIGS. 5 and 6, the memory cell MC is assumed to have an ability to store 2-bit data (00, 01, 10, 11).

In the read operation, control signals $\varphi_{pre}$, $\varphi_{sw}$, $\varphi_{CS}$ are set to the high level, changing the precharge transistor $Q_{pre}$, the switch elements $Q_{SW0}$, $Q_{SW1}$, $Q_{SW2}$, and the transistor $Q_{CS}$ (column selector) to the on-state. A precharge potential $V_{pre}$ is transferred to the bit line BL and the sense nodes $N_0$, $N_1$, $N_2$.

After that, the control signal $\varphi_{pre}$ is set to the low level and the precharge transistor $Q_{pre}$ changes to the off-state. The sense nodes $N_0$, $N_1$, $N_2$ are in a floating state and have the precharge potential $V_{pre}$.

When the data in the memory cell MC is read to the sense nodes $N_0$, $N_1$, $N_2$, the sense nodes $N_0$, $N_1$, $N_2$ change to a value corresponding to the data stored in the memory cell MC. When, for example, the data 00, 01, 10, or 11 is stored in the memory cell MC, the sense nodes $N_0$, $N_1$, $N_2$ change from $V_{pre}$ to $V_{00}$, $V_{01}$, $V_{10}$, or $V_{11}$.

After the sense nodes $N_0$, $N_1$, $N_2$ are changed to the value corresponding to the data stored in the memory cell MC, the control signal $\varphi_{sw}$, $\varphi_{CS}$ is set to the low level to separate the sense nodes $N_0$, $N_1$, $N_2$ from each other. After the sense nodes $N_0$, $N_1$, $N_2$ are separated from each other, the sense amplifiers SA0, SA1, SA2 are operated.

The reference potential $V_{ref0}$ supplied to the sense amplifier SA0, the reference potential $V_{ref1}$ supplied to the sense amplifier SA1, and the reference potential $V_{ref2}$ supplied to the sense amplifier SA2 are different from each other. For example, as illustrated in FIG. 6, the following relationships are satisfied:

$$V_{ref0} < V_{ref1} < V_{ref2}, V_{00} < V_{ref0} < V_{01}, V_{01} < V_{ref1} < V_{10},$$
$$V_{10} < V_{ref2} < V_{11}$$

The backgate potentials $V_{BP0}$, $V_{BP1}$, $V_{BP2}$, $V_{BN0}$, $V_{BN1}$, $V_{BN2}$ of the write-back transistors $QP_0$, $QP_1$, $QP_2$, $QN_0$, $QN_1$, $QN_2$ are changed as described above before or after the sense amplifiers SA0, SA1, SA2 are operated.

In this case, when the read data (data stored in the memory cell MC) is 00, the sense nodes $N_0$, $N_1$, $N_2$ are at $V_{00}$ ($<V_{ref0}$, $<V_{ref1}$, $<V_{ref2}$). For example, as illustrated in FIG. 7, when the read data is 00, the sense nodes $N_0$, $N_1$, $N_2$ change to the low level (0) in response to the start of the sense amplifiers SA0, SA1, SA2.

As a result, the write-back transistors $QN_0$, $QN_1$, $QN_2$ are in the off-state and the write-back transistor $QP_0$ changes to the on-state. The write-back potential $V_{WB00}$ used to write back the read data 00 to the memory cell MC is transferred to the memory cell MC via the write-back potential line WB.

When the read data is 01, the sense nodes $N_0$, $N_1$, $N_2$ are at $V_{01}$ ($>V_{ref0}$, $<V_{ref1}$, $<V_{ref2}$). For example, as illustrated in FIG. 7, when the read data is 01, the sense node $N_0$ changes to the high level (1) and the sense nodes $N_1$, $N_2$ change to the low level (0) in response to the start of the sense amplifiers SA0, SA1, SA2.

As a result, the write-back transistors $QP_0$, $QN_1$, $QN_2$ is in the off-state and the write-back transistor $QN_0$, $QP_1$ change to the on-state. The write-back potential $V_{WB01}$ used to write back the read data 01 to the memory cell MC is transferred to the memory cell MC via the write-back potential line WB.

When the read data is 10, the sense nodes $N_0$, $N_1$, $N_2$ are at $V_{10}$ ($>V_{ref0}$, $>V_{ref1}$, $<V_{ref2}$). For example, as illustrated in FIG. 7, when the read data is 10, the sense nodes $N_0$, $N_1$ change to the high level (1) and the sense node $N_2$ changes to the low level (0) in response to the start of the sense amplifiers SA0, SA1, SA2.

As a result of this, the write-back transistors $QP_0$, $QP_1$, $QN_2$ change to the off-state and the write-back transistor $QN_1$, $QP_2$ change to the on-state. The write-back potential $V_{WB10}$ used to write back the read data 10 to the memory cell MC is transferred to the memory cell MC via the write-back potential line WB.

When the read data is 11, the sense nodes $N_0$, $N_1$, $N_2$ are at $V_{10}$ ($>V_{ref0}$, $>V_{ref1}$, $>V_{ref2}$). For example, as illustrated in FIG. 7, when the read data is 11, the sense nodes $N_0$, $N_1$, $N_2$ change to the high level (1) in response to the start of the sense amplifiers SA0, SA1, SA2.

As a result, the write-back transistors $QP_0$, $QP_1$, $QP_2$ change to the off-state and the write-back transistor $QN_2$ changes to the on-state. The write-back potential $V_{WB11}$ used to write back the read data 11 to the memory cell MC is transferred to the memory cell MC via the write-back potential line WB.

As illustrated in FIGS. 8 and 9, the read data (2-bit data) $D_r$ is generated by a logic circuit 19.

As illustrated in FIGS. 7, 8, and 9, for example, when output signals $D_{r0}$, $D_{r1}$, $D_{r2}$ (high level 1 or low level 0) of the sense amplifiers SA0, SA1, SA2 are supplied to the logic circuit 19, the read data (00, 01, 10, 11) from the memory cell MC is identical to the read data (upper bit and lower bit) $D_r$ output from the logic circuit 19.

FIG. 10 is a flowchart of the read operation.

For example, the read operation is executed in step ST10, and the write-back operation is executed in step ST11.

The write-back operation (step ST11) can be executed immediately after the execution of the read operation (step ST10). Specifically, the backgate bias effect of the write-back transistors allows the write-back operation (step ST11) to be executed, for example, before the data is determined in ST12 or the level of the sense node is fixed.

Output of the read data (step ST13) is executed independently of the write-back operation (step ST11) using the logic circuit 19 of FIG. 8.

Application to DRAM

The semiconductor memory device illustrated in FIGS. 1 to 9 is described when applied to a DRAM.

FIG. 11 illustrates a memory cell array of a DRAM.

A memory cell array 18 corresponds to the memory cell array 18 in FIG. 1.

A memory cell $U_{ij}$ comprises a capacitor $C_{ij}$ and, for example, an N-channel transistor (FET) $T_{ij}$ which are connected in series, where i and j is 0, 1, 2, . . . .

The capacitor $C_{ij}$ has first and second electrodes. The transistor $T_{ij}$ has a first current terminal connected to the first electrode, a second current terminal connected to a bit line $BL_j$, and a control terminal that controls turn-on and turn-off of the current path between the first and second current terminals.

The bit line $BL_j$ extends, for example, in a first direction and is connected to the sense nodes $N_0$, $N_1$, $N_2$ illustrated in FIG. 2. A source line $SL_j$ is connected to the second electrode of the capacitor $C_{ij}$ and extends, for example, in the first direction. A word line $WL_i$ is connected to the control terminal of the transistor $T_{ij}$ and extends, for example, in a second direction crossing the first direction.

Figures 12, 13:
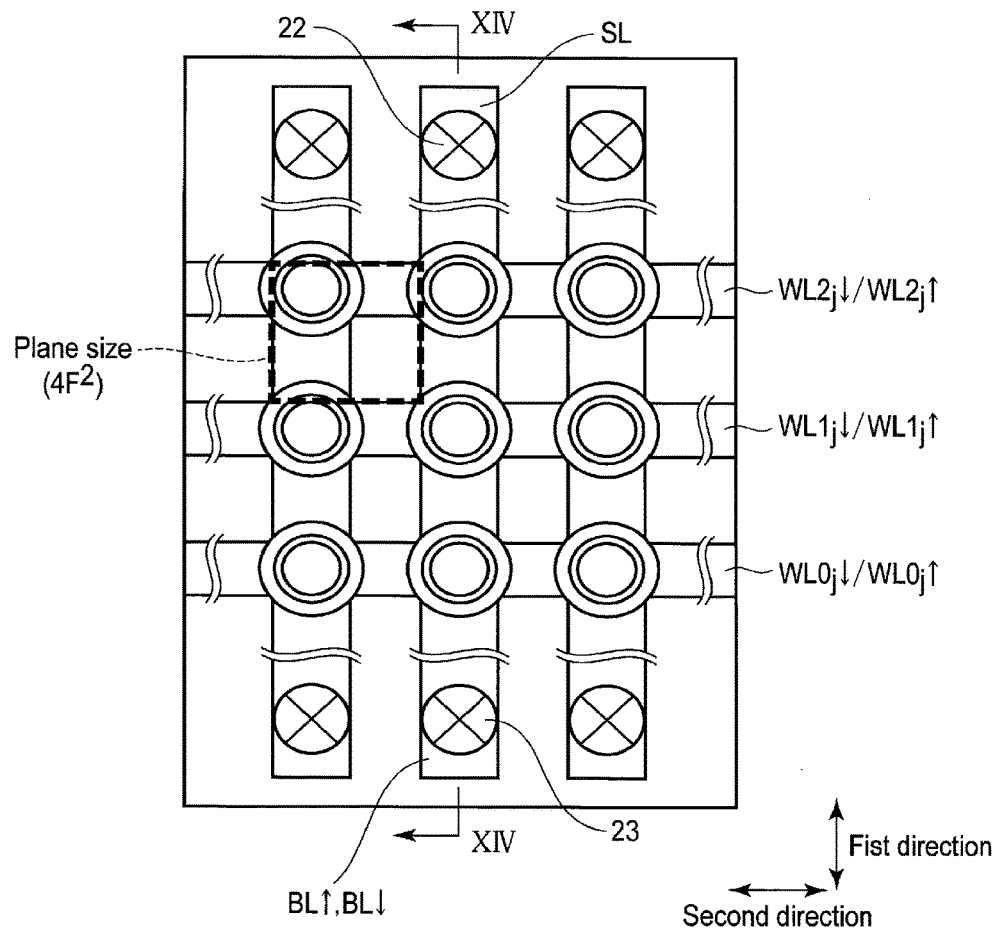
FIG. 12 illustrates example multi-bit data stored in a memory cell.
FIG. 13 is a plan view of a three-dimensional DRAM.

FIG. 12 illustrates example data stored in the memory cell of DRAM.

In this example, 2-bit data (00, 01, 10, or 11) is stored in the memory cell.

The memory cell comprises the capacitor $C_{ij}$ and the transistor $T_{ij}$ which are connected in series between the bit line $BL_j$ and the source line $SL_j$, as illustrated by an equivalent circuit in FIG. 12.

When $V_{storage}$ ($=V_{cap}-V_{SL}$) is $V_{w00}$ (e.g., 0V), the memory cell stores data 00. When $V_{storage}$ is $V_{w01}$ (e.g., (⅓)×$V_{dd}$), the memory cell stores data 01. When $V_{storage}$ is $V_{w10}$ (e.g., (⅔)×$V_{dd}$), the memory cell stores data 10. When $V_{storage}$ is $V_{w11}$ (e.g., $V_{dd}$), the memory cell stores data 11.

It is noted that $V_{w00}<V_{w01}<V_{w10}<V_{w11}$.

FIG. 13 is a plan view of a three-dimensional DRAM. FIG. 14 is a cross-sectional view taken along line XIV-XIV of FIG. 13.

Cost reduction of the DRAM is achieved by, for example, storing multiple bits (multi-level) in the memory cell (capacitor) of the DRAM, as described above. In addition, the cost reduction can also be achieved by providing the DRAM in a three-dimensional structure as described below. A large capacity DRAM is achieved and the cost per bit is reduced.

The three-dimensional structure of the DRAM is achieved by disposing memory cells (transistors and capacitors) above the top surface of the semiconductor substrate. Periphery circuits, such as sense amplifiers, are disposed on the semiconductor substrate, and the memory cell array is disposed at an upper position above the periphery circuits.

As illustrated in FIG. 14, a semiconductor substrate 20 is, for example, a silicon substrate having a top surface. Peripheral circuits 21A, 21B are disposed on the top surface of the semiconductor substrate 20. A transistor (e.g., FET) $Q_{CS}$ is disposed on the semiconductor substrate 20. The transistor $Q_{CS}$ corresponds to, for example, the transistor $Q_{CS}$ in FIG. 2. A transistor T_SL is a select element that selects a source line SL in the three-dimensional DRAM.

A memory cell array is disposed above the peripheral circuits 21A, 21B. The memory cell array includes two blocks BK0, BK1 which are stacked on top of each other. Two blocks are provided in this example, but other than two blocks may be provided. One, two, or more than two blocks may be provided.

The two blocks BK0, BK1 each have two sub-arrays $MA_\downarrow$, $MA_\uparrow$. The sub-array $MA_\downarrow$ comprises a bit line $BL_\downarrow$, a source line SL disposed above the bit line $BL_\downarrow$, and a memory cell (a transistor $T_{ij\downarrow}$ and a capacitor $C_{ij\downarrow}$) disposed between the bit line $BL_\downarrow$ and the source line SL.

The sub-array $MA_\uparrow$ comprises a source line SL, a bit line $BL_\uparrow$ disposed above the source line SL, and a memory cell (a transistor $T_{ij\uparrow}$ and a capacitor $C_{ij\uparrow}$) disposed between the bit line $BL_\uparrow$ and the source line SL. The sub-arrays $MA_\downarrow$ and $MA_\uparrow$ share a common conductive wire as the source line SL (area X). The source line SL is connected to the peripheral circuit 21B via the transistor T_SL and a contact plug 22.

The block BK1 and the block BK0 share a common conductive wire as the bit lines $BL_\uparrow$ and $BL_\downarrow$ (area Y). The bit line $BL_\downarrow$ and the bit line $BL_\uparrow$ are connected to the transistor $Q_{CS}$ via a contact plug 23.

The bit line $BL_\downarrow$, $BL_\uparrow$ and the source line SL extend in a first direction along the top surface of the semiconductor substrate 20. The word lines $WL_{ij\downarrow}$, $WL_{ij\uparrow}$ extend in a second direction along the top surface of the semiconductor substrate 20 and crossing the first direction.

The memory cell in the sub-array $MA_\downarrow$ comprises the transistor $T_{ij\downarrow}$ and the capacitor $C_{ij\downarrow}$ disposed on the transistor $T_{ij\downarrow}$.

For example, as illustrated in FIG. 15, the transistor $T_{ij\downarrow}$ comprises a semiconductor layer (semiconductor pillar) $24_\downarrow$ acting as a channel (current path), a gate insulating layer $25_\downarrow$, and a word line $WL_{ij\downarrow}$. The bottom surface of the semiconductor layer $24_\downarrow$ is connected to the bit line $BL_\downarrow$ in FIG. 14. The capacitor $C_{ij\downarrow}$ includes a pillar electrode portion $26_\downarrow$, an insulating portion $27_\downarrow$ covering the pillar electrode portion $26_\downarrow$, and a cell electrode portion $28_\downarrow$ covering the insulating portion $27_\downarrow$. The top surface of the pillar electrode portion $26_\downarrow$ is connected to the source line SL. The bottom surface of the cell electrode portion $28_\downarrow$ is connected to the semiconductor layer $24_\downarrow$.

The transistor $T_{ij\downarrow}$ is a vertical transistor that comprises, for example, the semiconductor layer $24_\downarrow$ provided as a channel disposed above the semiconductor substrate 20, with the semiconductor layer $24_\downarrow$ crossing the upper surface of the semiconductor substrate 20. The semiconductor layer $24_\downarrow$ may include any material that is independent of the semiconductor substrate 20. For example, the semiconductor layer $24_\downarrow$ may be an epitaxial single crystal silicon layer, a polysilicon layer, or an amorphous silicon layer.

The semiconductor layer $24_\downarrow$ may be an oxide semiconductor layer.

A recent research presents a so-called oxide semiconductor thin film transistor (TFT) having an excellent off-leak characteristic (a small leak current in off-time). A characteristic of the oxide semiconductor TFT is the use of an oxide semiconductor as a channel. The oxide semiconductor is so-called IGZO (InGaZnO) that includes, for example, indium oxide, gallium oxide, and zinc oxide. The oxide semiconductor may be, for example, tin oxide, aluminum oxide, or silicon oxide. These oxide semiconductors TFT can be used in the transistor $T_{ij\downarrow}$.

The oxide semiconductor TFT is a very effective technology to provide three-dimensional DRAMs, because the oxide semiconductor TFT can be formed by a low temperature process of about 200° C. to protect the peripheral circuits 21A, 21B on the semiconductor substrate 20 from thermal stress in the wafer process. In addition, the oxide semiconductor TFT can largely reduce the leak current during off-time compared to a typical silicon channel transistor.

Use of the oxide semiconductor (e.g., IGZO), therefore, as the semiconductor layer $24_\downarrow$ achieves a DRAM having a very long data retention time (ultra long retention DRAM (ULR DRAM)).

For example, the retention time of the transistor $T_{ij\downarrow}$ having a silicon channel is about 64 msec. This requires a short data-refresh (rewrite) cycle. In contrast, the retention time of the transistor $T_{ij\downarrow}$ having the IGZO channel is about 10 days. Thus, the data refresh does not affect the performance of the system.

In the present embodiment, the semiconductor layer $24_\downarrow$ serving as the channel of the transistor $T_{ij\downarrow}$ is shaped like a column, but other shape may be used. The gate insulating layer $25_\downarrow$ includes an insulator, such as silicon oxide. The word line $WL_{ij\downarrow}$ includes a metallic material, such as aluminum, copper, or tungsten.

The capacitor $C_{ij\downarrow}$ is a so-called fin-type capacitor. The capacitor $C_{ij\downarrow}$ is shaped like a column, but other shape may be used. The pillar electrode portion $26_\downarrow$ and the cell electrode portion $28_\downarrow$ include a metallic material, such as aluminum, copper, or tungsten. The insulating portion $27_\downarrow$ includes, for example, copper oxide, tungsten oxide, silicon oxide, aluminum oxide, hafnium oxide, zirconium oxide, tantalum oxide, or a stacked structure of these oxides.

The memory cell in the sub-array $MA_\uparrow$ includes the capacitor $C_{ij\uparrow}$ and the transistor $T_{ij\uparrow}$ disposed on the capacitor $C_{ij\uparrow}$.

As illustrated in FIG. 16, for example, the transistor $T_{ij\uparrow}$ includes the semiconductor layer (semiconductor pillar) $24_\uparrow$ as a channel (current path), the gate insulating layer $25_\uparrow$, and the word line $WL_{ij\uparrow}$. The top surface of the semiconductor layer $24_\uparrow$ is connected to the bit line $BL_\uparrow$ in FIG. 14. The capacitor $C_{ij\uparrow}$ includes the pillar electrode portion $26_\uparrow$, the insulating portion $27_\uparrow$ covering the pillar electrode portion $26_\uparrow$, and the cell electrode portion $28_\uparrow$ covering the insulating portion $27_\uparrow$. The bottom surface of the pillar electrode portion $26_\uparrow$ is connected to the source line SL. The top surface of the cell electrode portion $28_\uparrow$ is connected to the semiconductor layer $24_\uparrow$.

Similar to the transistor $T_{ij\downarrow}$ in the sub-array $MA_\downarrow$, the transistor $T_{ij\uparrow}$ is a vertical transistor with the semiconductor layer $24_\uparrow$ crossing the upper surface of the semiconductor substrate 20. Similar to the capacitor $C_{ij\downarrow}$ in the sub-array $MA_\downarrow$, the capacitor $C_{ij\uparrow}$ is the fin-type capacitor.

The transistor $T_{ij\uparrow}$ and the capacitor $C_{ij\uparrow}$ differ from the transistor $T_{ij\downarrow}$ and the capacitor $C_{ij\downarrow}$ in that the transistor and the capacitor are disposed upside down.

A transistor $Q_{pre}$ in FIG. 14 is connected to the bit line $BL_\downarrow$ and the bit line $BL_\uparrow$. The transistor $Q_{pre}$ corresponds to the transistor $Q_{pre}$ in FIG. 2. The transistor $Q_{pre}$ is directly connected to the bit lines $BL_\downarrow$, $BL_\uparrow$ to achieve the three-dimensional structure as the vertical transistor. However, as illustrated in FIG. 2, the transistor $Q_{pre}$ may be disposed in the peripheral circuit 21A (including the read circuit 17 in FIG. 2).

Similar to the transistors $T_{ij\downarrow}$, $T_{ij\uparrow}$ of the memory cell, the transistor $Q_{pre}$ is a vertical transistor.

As illustrated in FIGS. 17 and 18, for example, the transistor $Q_{pre}$ includes the semiconductor layers (semiconductor pillar) $24_\downarrow$, $24_\uparrow$ as channels (current paths), the gate insulating layers $25_\downarrow$, $25_\uparrow$, and the gate electrodes G1, G2. The bottom surface of the semiconductor layer $24_\downarrow$ is connected to the bit line $BL_\downarrow$, while the top surface of the semiconductor layer $24_\uparrow$ is connected to the bit line $BL_\uparrow$ in FIG. 14.

The fact that the transistor $Q_{pre}$ is disposed as the vertical transistor in the memory cell array allows high speed charging of the bit lines $BL_\downarrow$ and $BL_\uparrow$.

As illustrated in FIG. 19, the transistor T_SL, for example, also include the semiconductor layer (semiconductor pillar) $24_\uparrow$ as a channel (current path), the gate insulating layer $25_\uparrow$, and the gate electrode G3. The semiconductor layer $24_\uparrow$ is connected between the source line SL and the peripheral circuit 21B. Similar to the transistor $Q_{pre}$, the position of the transistor T_SL is changeable.

Such a three-dimensional DRAM can execute read and write operations in parallel, for example, in the block BK0 and the block BK1. The read and write operations in the sub-array $MA_\downarrow$ in the block BK0 and the read and write operations in the sub-array $MA_\uparrow$ in the block BK0 are executed serially by the common source line SL.

In the read and write operations in the sub-array $MA_\downarrow$ n the block BK0, one of a plurality of word lines $WL_{ij\downarrow}$ is selected. The electric potential of the selected word line is set to an active state (high level), while the electric potential of the other word lines is set to a non-active state (low level).

The three-dimensional DRAM can achieve a plane size of $4F^2$ for each memory cell in each sub-array, as apparently illustrated in the plan view of FIG. 13. If, for example, n blocks or $2^n$ sub-arrays are stacked on the semiconductor substrate 20, the plane size for each memory cell can be $2F^2/n$ ($=4F^2/2n$), where n is a natural number equal to or larger than 1.

As illustrated in the cross-sectional structure in FIG. 14, the bit line $BL_\downarrow$, the source line SL, and the bit line $BL_\uparrow$ are stacked in one block. Alternatively, the source line, the bit line, and the source line may be stacked in one block. For example, in FIG. 14, a plurality of blocks may be stacked on the semiconductor substrate 20. Each block is regarded as a basic unit including the source line SL, the bit line $BL_\downarrow$ or $BL_\uparrow$, and the source line SL.

FIG. 20 illustrates example read waveform of the DRAM in which the memory cell stores 2-bit data.

Sense amplifiers SA0, SA1, SA2 correspond to the sense amplifiers SA0, SA1, SA2 in FIG. 2. In the memory cell of the DRAM, 2-bit data (00, 01, 10, 11) and $V_{storage}$ has a relationship as illustrated in FIG. 12.

First, the read operation is executed, and the sense nodes $N_0$, $N_1$, $N_2$ are fixed to the high or low level using the sense amplifiers SA0, SA1, SA2.

In precharging the sense amplifiers SA0, SA1, SA2 before operation, the bit line BL and the sense nodes $N_0$, $N_1$, $N_2$ are set to $V_{pre}=(3/6) \times V_{dd}$.

The reference potential $V_{ref0}$ of the sense amplifier SA0 is set to $(1/6) \times V_{dd}$, the reference potential $V_{ref1}$ of the sense amplifier SA1 is set to $(3/6) \times V_{dd}$, and the reference potential $V_{ref2}$ of the sense amplifier SA2 is set to $(5/6) \times V_{dd}$.

When the data 00 is stored in the memory cell, the sense amplifier SA0 changes the sense node $N_0$ from $V_{pre}=(3/6) \times V_{dd}$ to the low level $V_{ss}$. When the data 01, 10, or 11 is stored in the memory cell, the sense amplifier SA0 changes the sense node $N_0$ from $V_{pre}=(3/6) \times V_{dd}$ to the high level $V_{dd}$.

When the data 00 or 01 is stored in the memory cell, the sense amplifier SA1 changes the sense node $N_1$ from $V_{pre}=$ ($3/6$)×$V_{dd}$ to the low level $V_{ss}$. When the data 10 or 11 is stored in the memory cell, the sense amplifier SA1 changes the sense node $N_1$ from $V_{pre}=(3/6)×V_{dd}$ to the high level $V_{dd}$.

When the data 00, 01, or 10 is stored in the memory cell, the sense amplifier SA2 changes the sense node $N_2$ from $V_{pre}=(3/6)×V_{dd}$ to the low level $V_{ss}$. When the data 11 is stored in the memory cell, the sense amplifier SA2 changes the sense node $N_2$ from $V_{pre}=(3/6)×V_{dd}$ to the high level $V_{dd}$.

Consequently, the logic circuit 19 in FIG. 8 outputs 00 as the read data $D_r$ when the read data is 00 or the sense nodes $N_0$ ($D_{r0}$), $N_1$ ($D_{r1}$), $N_2$ ($D_{r2}$) are at the low level (000).

The logic circuit 19 in FIG. 8 outputs 01 as the read data $D_r$ when the read data is 01 or the sense node $N_0$ ($D_{r0}$) is at the high level and the sense nodes $N_1$ ($D_{r1}$), $N_2$ ($D_{r2}$) are at the low level (100).

The logic circuit 19 in FIG. 8 outputs 10 as the read data $D_r$ when the read data is 10 or the sense nodes $N_0$ ($D_{r0}$), $N_1$ ($D_{r1}$) are at the high level and the sense node $N_2$ ($D_{r2}$) is at the low level (110).

The logic circuit 19 in FIG. 8 outputs 11 as the read data $D_r$ when the read data is 11 or the sense nodes $N_0$ ($D_{r0}$), $N_1$ ($D_{r1}$), $N_2$ ($D_{r2}$) are at the high level (111).

Second Embodiment

FIGS. 21 and 22 are circuit diagrams according to a second embodiment.

The second embodiment is a modification of the first embodiment. Specifically, a read circuit 17 in FIG. 21 corresponds to the read circuit 17 in FIG. 2, and a read circuit 17 in FIG. 22 corresponds to the read circuit 17 in FIG. 3. In FIGS. 21 and 22, the same reference signs are given to constituent components similar to those in FIGS. 2 and 3 and such constituent components will not be described again in detail.

The second embodiment aims to improve the read performance by decreasing parasitic capacitance and achieving high speed reading of the electric potential from the memory cell MC to be read to the sense nodes $N_0$, $N_1$, $N_2$. Therefore, the read circuit 17 includes a switch element $Q_{cut}$ connected between the bit line BL (memory cell MC) and the write-back potential line WB. The switch element $Q_{cut}$ is an FET, such as an N-channel transistor, in which a control signal $\varphi_{cut}$ is supplied to the control terminal.

The switch element $Q_{cut}$ is preferably a vertical transistor similar to the precharge transistor $Q_{pre}$ illustrated in FIGS. 17 and 18.

The switch element $Q_{cut}$ electrically separates the write-back potential line WB from the bit line BL and the sense nodes $N_0$, $N_1$, $N_2$ in order to decrease parasitic capacitance and achieve high-speed sensing during the precharge of the sense nodes $N_0$, $N_1$, $N_2$ and the reading of data from the memory cell MC to the sense nodes $N_0$, $N_1$, $N_2$.

For example, the controller 12 in FIG. 1 sets the control signal $\varphi_{cut}$ to the low level and the control signals $\varphi_{CS}$, $\varphi_{pre}$, $\varphi_{SW}$ to the high level, thus setting the transistor $Q_{cut}$ to the off-state. The controller then sets the transistors $Q_{pre}$, $Q_{SW0}$, $Q_{SW1}$, $Q_{SW2}$ to the on-state. This allows the data (00, 01, 10, 11) stored in the memory cell MC to be read to the sense nodes $N_0$, $N_1$, $N_2$ with no influence of parasitic capacitance by the write-back potential line WB.

Meanwhile, the controller 12 in FIG. 1 sets the control signal $\varphi_{cut}$ to the high level after setting the transistors Qpre, $Q_{SW0}$, $Q_{SW1}$, $Q_{SW2}$ to the off-state, in order to change the transistor $Q_{cut}$ to the on-state. The transistor $Q_{cut}$ is turned on at any timing, for example, after the transistors $Q_{SW0}$, $Q_{SW1}$, $Q_{SW2}$ are turned off at time $t_p$, as illustrated in FIG. 23, before or after the sense amplifiers SA0, SA1, SA2 are operated.

This is because the write-back potentials $V_{WB00}$, $V_{WB01}$, $V_{WB10}$, $V_{WB11}$ can be transferred to the memory cell MC before the levels of the sense nodes $N_0$, $N_1$, $N_2$ are fixed by the backgate bias effect of the write-back transistors $QP_0$, $QN_0$, $QP_1$, $QN_1$, $QP_2$, $QN_2$, as described in the first embodiment.

Subsequently, the write-back potentials $V_{WB00}$, $V_{WB01}$, $V_{WB10}$, $V_{WB11}$ are actually transferred to the memory cell MC.

Since the second embodiment aims to achieve the high-speed data read from the memory cell MC to the sense nodes $N_0$, $N_1$, $N_2$, the backgate bias effect of the write-back transistors $QP_0$, $QN_0$, $QP_1$, $QN_1$, $QP_2$, $QN_2$ may not be needed. Specifically, the backgate terminals of the write-back transistors $QP_0$, $QN_0$, $QP_1$, $QN_1$, $QP_2$, $QN_2$ can be eliminated in the second embodiment.

As described above, the second embodiment achieves high speed read of the data from the memory cell MC to the sense nodes $N_0$, $N_1$, $N_2$, thus improving the reading performance.

Third Embodiment

FIG. 24 is a circuit diagram of a read circuit according to a third embodiment.

A third embodiment is also a modification of the first embodiment. Specifically, a read circuit 17 in FIG. 24 corresponds to the read circuit 17 in FIG. 2. In FIG. 24, the same reference signs are given to constituent components similar to those in FIG. 2 and such constituent components will not be described again in detail.

In the third embodiment, the write-back potentials $V_{WB00}$, $V_{WB01}$, $V_{WB10}$, $V_{WB11}$ are transferred by using only the N-channel transistors (FETs) to reduce an area of the read circuit 17, thus achieving improved reading performance.

The read circuit 17 in FIG. 24 differs from the read circuit 17 in FIG. 2 in that the write-back transistors $QP_0$, $QP_1$, $QP_2$ are eliminated and a write-back transistor (N-channel transistor) QNN is added.

The write-back transistor QNN has a control terminal to which the control signal $\varphi_{on}$ is supplied. The write-back transistor QNN are set to the on-state by the controller 12 in FIG. 1 after the data is read from the memory cell MC to the sense nodes $N_0$, $N_1$, $N_2$ and the switch elements $Q_{SW0}$, $Q_{SW1}$, $Q_{SW2}$ are set to the off-state. When the write-back transistor QNN is in the on-state, the write-back potential $V_{WB00}$ is transferred to the write-back potential line WB.

The third embodiment can be combined with the first or second embodiment, or both the first and second embodiments.

For example, as illustrated in FIG. 25, the write-back transistors QNN, $QN_0$, $QN_1$, $QN_2$ may each have a backgate terminal. In the example of FIG. 25, different backgate potentials $V_{BNN}$, $V_{BN0}$, $V_{BN1}$, $V_{BN2}$ are applied to each of the backgate terminals. Alternatively, the backgate terminals may be commonly connected and a common backgate potential $V_{BN}$ may be applied to such backgate terminals, as in the example of FIG. 3.

As illustrated in FIG. 26, the read circuit 17 may include a switch element $Q_{cut}$. The role of the switch element $Q_{cut}$ has been described in connection with the second embodiment, and the description is not repeated. The write-back transistors QNN, $QN_0$, $QN_1$, $QN_2$ in FIG. 26 may each have the backgate terminals as in the example of FIG. 25. In this case, the backgate terminals may be commonly connected.

Operation

An exemplary write-back operation using the read circuit in FIG. 24 is described.

As illustrated in FIGS. 5 and 6, the memory cell MC is assumed to have an ability to store 2-bit data (00, 01, 10, 11).

In the read operation, control signals $\varphi_{pre}$, $\varphi_{sw}$, $\varphi_{CS}$ are set to the high level, changing the precharge transistor $Q_{pre}$, the switch elements $Q_{SW0}$, $Q_{SW1}$, $Q_{SW2}$, and the transistor $Q_{CS}$ (column selector) to the on-state. A precharge potential $V_{pre}$ is transferred to the bit line BL and the sense nodes $N_0$, $N_1$, $N_2$.

After that, the control signal $\varphi_{pre}$ is set to the low level and the precharge transistor $Q_{pre}$ changes to the off-state. The sense nodes $N_0$, $N_1$, $N_2$ are in the floating state and have the precharge potential $V_{pre}$.

When the data in the memory cell MC is read to the sense nodes $N_0$, $N_1$, $N_2$, the sense nodes $N_0$, $N_1$, $N_2$ change to a value corresponding to the data stored in the memory cell MC. For example, when the data 00, 01, 10, or 11 is stored in the memory cell MC, the sense nodes $N_0$, $N_1$, $N_2$ change from $V_{pre}$ to $V_{00}$, $V_{01}$, $V_{10}$, $V_{11}$.

After the sense nodes $N_0$, $N_1$, $N_2$ are changed to the values corresponding to the data stored in the memory cell MC, the control signals $\varphi_{sw}$, $\varphi_{CS}$ are set to the low level to separate the sense nodes $N_0$, $N_1$, $N_2$ from each other. After the sense nodes $N_0$, $N_1$, $N_2$ are separated from each other, the control signal $\varphi_{on}$ is set to the high level and the write-back transistor QNN is set to the on-state. After the sense nodes $N_0$, $N_1$, $N_2$ are separated from each other, the sense amplifiers SA0, SA1, SA2 are operated.

As illustrated in FIG. 6, the reference potential $V_{ref0}$ supplied to the sense amplifier SA0, the reference potential $V_{ref1}$ supplied to the sense amplifier SA1, and the reference potential $V_{ref2}$ supplied to the sense amplifier SA2 satisfy the following relationships: $V_{ref0}<V_{ref1}<V_{ref2}$, $V_{00}<V_{ref0}<V_{01}$, $V_{01}<V_{ref1}<V_{10}$, $V_{10}<V_{ref2}<V_{11}$.

In this case, when the read data (data stored in the memory cell MC) is 00, the sense nodes $N_0$, $N_1$, $N_2$ are at $V_{00}$ ($<V_{ref0}$, $<V_{ref1}$, $<V_{ref2}$). For example, as illustrated in FIG. 7, when the read data is 00, the sense nodes $N_0$, $N_1$, $N_2$ change to the low level (0) in response to the start of the sense amplifiers SA0, SA1, SA2.

As a result, as illustrated in FIG. 27A, only the write-back transistor QNN changes to the on-state, and the write-back potential $V_{WB00}$, which writes back the read data 00 to the memory cell MC, is transferred to the memory cell MC via the write-back potential line WB.

When the read data is 01, the sense nodes $N_0$, $N_1$, $N_2$ are at $V_{01}$ ($>V_{ref0}$, $<V_{ref1}$, $<V_{ref2}$). For example, as illustrated in FIG. 7, when the read data is 01, the sense node $N_0$ changes to the high level (1) and the sense nodes $N_1$, $N_2$ change to the low level (0) in response to the start of the sense amplifiers SA0, SA1, SA2.

As a result, as illustrated in FIG. 27B, the write-back transistor QNN changes to the on-state, while the write-back transistor $QN_0$ changes to the on-state. The write-back potential $V_{WB01}$, which writes back the read data 01 to the memory cell MC, is transferred to the memory cell MC via the write-back potential line WB.

When the read data is 10, the sense nodes $N_0$, $N_1$, $N_2$ are at $V_{10}$ ($>V_{ref0}$, $>V_{ref1}$, $<V_{ref2}$). For example, as illustrated in FIG. 7, when the read data is 10, the sense nodes $N_0$, $N_1$ change to the high level (1) and the sense node $N_2$ changes to the low level (0) in response to the start of the sense amplifiers SA0, SA1, SA2.

Figure 27C:
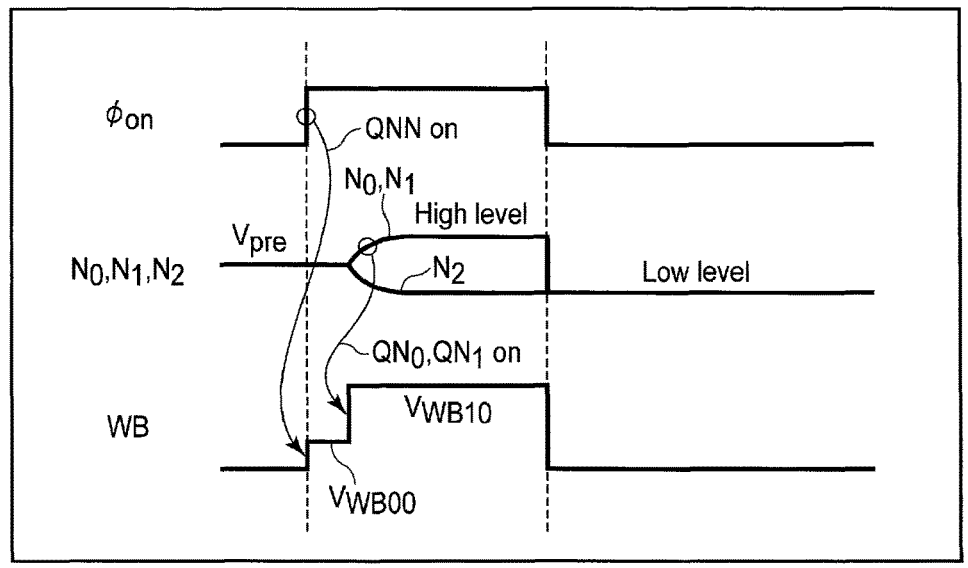
FIG. 27C is a waveform diagram of the electric potential of sense nodes relative to a write-back potential.

As a result, as illustrated in FIG. 27C, the write-back transistor QNN changes to the on-state, while the write-back transistor $QN_0$, $QN_1$ change to the on-state. The write-back potential $V_{WB10}$, which writes back the read data 10 to the memory cell MC, is transferred to the memory cell MC via the write-back potential line WB.

When the read data is 11, the sense nodes $N_0$, $N_1$, $N_2$ are at $V_{10}$ ($>V_{ref0}$, $>V_{ref1}$, $>V_{ref2}$). For example, as illustrated in FIG. 7, when the read data is 11, the sense nodes $N_0$, $N_1$, $N_2$ change to the high level (1) in response to the start of the sense amplifiers SA0, SA1, SA2.

Figure 27D:
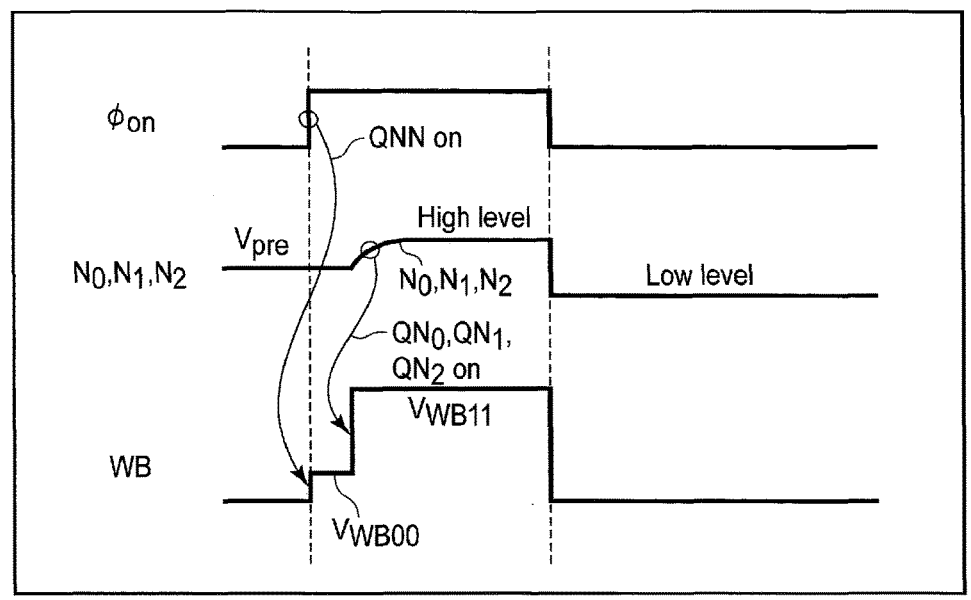
FIG. 27D is a waveform diagram of the electric potential of sense nodes relative to a write-back potential.

As a result, as illustrated in FIG. 27D, the write-back transistor QNN changes to the on-state, while the write-back transistor $QN_0$, $QN_1$, $QN_2$ change to the on-state. The write-back potential $V_{WB11}$, which writes back the read data 11 to the memory cell MC, is transferred to the memory cell MC via the write-back potential line WB.

As described above, the third embodiment transfers the write-back potentials $V_{WB00}$, $V_{WB01}$, $V_{WB10}$, $V_{WB11}$ only to the N-channel transistors to reduce an area of the read circuit 17, thus achieving improved reading performance.

CONCLUSION

The above-described embodiments achieve improved reading performance of the semiconductor memory device in which the destructive read system is used.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A semiconductor memory device, comprising:
a memory cell capable of storing a first value and a second value;
a sense amplifier configured to amplify a sense node to a first read potential when the first value is read from the memory cell to the sense node, and amplify the sense node to a second read potential when the second value is read from the memory cell to the sense node;
a first transfer transistor having a first control terminal connected to the sense node and a first backgate terminal of the first control terminal, the first transfer transistor configured to transfer a first write potential to the memory cell when the sense node is at the first read potential;
a second transfer transistor having a second control terminal connected to the sense node and a second backgate terminal of the second control terminal, the second transfer transistor configured to transfer a second write potential to the memory cell when the sense node is at the second read potential; and
a controller configured to apply a first backgate potential to the first backgate terminal, and apply a second backgate potential to the second backgate terminal.
2. The device of claim 1, wherein
the memory cell is capable of storing $2^n$ values (n is a natural number equal to or larger than 1) including the first value and the second value.

3. The device of claim 1, wherein
the sense amplifier is disposed on a semiconductor substrate,
the memory cell includes a capacitor and a select transistor, the capacitor having a first electrode and a second electrode, the select transistor having a first current terminal connected to the first electrode, a second current terminal connected to the sense node, and a control terminal that controls turn-on and turn-off of a current path between the first and second current terminals, and
the current path includes an oxide semiconductor layer.

4. The device of claim 1, wherein
the first backgate potential is different from the second backgate potential.

5. The device of claim 1, wherein
the first backgate potential is identical to the second backgate potential.

6. A semiconductor memory device, comprising:
a memory cell capable of storing a first value and a second value;
a sense amplifier configured to amplify a sense node to a first read potential when the first value is read from the memory cell to the sense node, and amplify the sense node to a second read potential when the second value is read from the memory cell to the sense node;
a first transfer transistor having a first control terminal connected to the sense node, the first transfer transistor configured to transfer a first write potential to the memory cell via a conductive wire when the sense node is at the first read potential;
a second transfer transistor having a second control terminal connected to the sense node, the second transfer transistor configured to transfer a second write potential to the memory cell via the conductive wire when the sense node is at the second read potential;
a first switch element connected between the memory cell and the sense node;
a second switch element connected between the memory cell and the conductive wire; and
a controller configured to read the first value or the second value from the memory cell to the sense node by setting the first switch element to an on-state and setting the second switch element to an off-state.

7. The device of claim 6, wherein
the memory cell is capable of storing $2^n$ values (n is a natural number equal to or larger than 1) including the first value and the second value.

8. The device of claim 6, wherein
the sense amplifier is disposed on a semiconductor substrate,
the memory cell includes a capacitor and a select transistor, the capacitor having a first electrode and a second electrode, the select transistor having a first current terminal connected to the first electrode, a second current terminal connected to the sense node, and a control terminal that controls turn-on and turn-off of a current path between the first and second current terminals, and
the current path includes an oxide semiconductor layer.

9. The device of claim 6, wherein
the first transfer transistor has a first backgate terminal, and the second transfer transistor has a second backgate terminal.

10. The device of claim 9, wherein
the controller supplies a first backgate potential to the first backgate terminal, and supplies a second backgate potential to the second backgate terminal.

11. The device of claim 10, wherein
the first backgate potential is different from the second backgate potential.

12. The device of claim 10, wherein
the first backgate potential is identical to the second backgate potential.

13. A semiconductor memory device, comprising:
a memory cell capable of storing a first value and a second value;
a sense amplifier configured to amplify a sense node to a first read potential when the first value is read from the memory cell to the sense node, and amplify the sense node to a second read potential when the second value is read from the memory cell to the sense node;
a conductive wire connected to the memory cell;
a first N-channel transistor having a first control terminal to which a control signal is supplied, the first N-channel transistor configured to transfer a first write potential to the conductive wire;
a second N-channel transistor having a second control terminal connected to the sense node, the second N-channel transistor configured to transfer a second write potential to the conductive wire when the sense node is at the second read potential; and
a controller configured to set the first N-channel transistor to an on-state using the control signal when the sense node is at the first read potential or the second read potential.

14. The device of claim 13, wherein
the memory cell is capable of storing $2^n$ value (n is a natural number equal to or larger than 1) including the first value and the second value.

15. The device of claim 13, wherein
the sense amplifier is disposed on a semiconductor substrate,
the memory cell includes a capacitor and a select transistor, the capacitor having a first electrode and a second electrode, the select transistor having a first current terminal connected to the first electrode, a second current terminal connected to the sense node, and a control terminal that controls turn-on and turn-off of a current path between the first and second current terminals, and
the current path includes an oxide semiconductor layer.

16. The device of claim 13, wherein
the first N-channel transistor has a first backgate terminal, and the second N-channel transistor has a second backgate terminal.

17. The device of claim 16, wherein
the controller supplies a first backgate potential to the first backgate terminal, and supplies a second backgate potential to the second backgate terminal.

18. The device of claim 17, wherein
the first backgate potential is different from the second backgate potential.

19. The device of claim 13, further comprising:
a switch element connected between the memory cell and the conductive wire.

20. The device of claim 19, wherein
the controller sets the switch element to an off-state when the first value or the second value is read from the memory cell to the sense node.

* * * * *